(12) United States Patent
Hue et al.

(10) Patent No.: US 11,522,499 B2
(45) Date of Patent: Dec. 6, 2022

(54) INTEGRATED MULTIPLE-PATH POWER AMPLIFIER

(71) Applicant: NXP USA, Inc., Austin, TX (US)

(72) Inventors: Xavier Hue, Frouzins (FR); Margaret A. Szymanowski, Chandler, AZ (US); Xin Fu, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 256 days.

(21) Appl. No.: 17/112,005

(22) Filed: Dec. 4, 2020

(65) Prior Publication Data

US 2021/0175854 A1   Jun. 10, 2021

(30) Foreign Application Priority Data

Dec. 10, 2019   (EP) .................................... 19306623

(51) Int. Cl.
| | |
|---|---|
| *H03F 1/02* | (2006.01) |
| *H01L 23/66* | (2006.01) |
| *H01L 23/00* | (2006.01) |
| *H03F 3/195* | (2006.01) |
| *H03F 3/24* | (2006.01) |

(52) U.S. Cl.
CPC ........... *H03F 1/0288* (2013.01); *H01L 23/66* (2013.01); *H01L 24/49* (2013.01); *H03F 3/195* (2013.01); *H03F 3/245* (2013.01); *H01L 2223/6611* (2013.01); *H01L 2223/6655* (2013.01); *H01L 2224/49175* (2013.01); *H03F 2200/451* (2013.01)

(58) Field of Classification Search
CPC ............... H03F 1/02; H03F 1/07; H03F 3/191
USPC ..................................... 330/124 R, 295, 302
See application file for complete search history.

(56) References Cited

U.S. PATENT DOCUMENTS

| | | | |
|---|---|---|---|
| 7,078,976 B2* | 7/2006 | Blednov | ............... H03F 1/0288 330/53 |
| 7,939,864 B1* | 5/2011 | Blednov | ................. H01L 24/49 257/784 |
| 8,487,703 B2 | 7/2013 | Blednov | |

(Continued)

OTHER PUBLICATIONS

U.S. Appl. No. 16/449,994; not yet published; 48 pages, filed Jun. 24, 2019.

(Continued)

*Primary Examiner* — Henry Choe
(74) *Attorney, Agent, or Firm* — Sherry W Gourlay

(57) ABSTRACT

A multiple-path amplifier (e.g., a Doherty amplifier) includes first and second transistors (e.g., main and peaking transistors) with first and second output terminals, respectively, all of which is integrally-formed with a semiconductor die. A signal path through the second transistor extends in a direction from a control terminal of the second transistor to the second output terminal, where the second output terminal corresponds to or is closely electrically coupled to a combining node. The amplifier also includes an integrated phase delay circuit that is configured to apply an overall phase delay (e.g., 90 degrees) to a signal carried between the first and second output terminals. The integrated phase delay circuit includes delay circuit wirebonds coupled between the first and second output terminals, and the delay circuit wirebonds extend in a third direction that is angularly offset from (e.g., perpendicular to) the second direction.

20 Claims, 4 Drawing Sheets

(56) References Cited

U.S. PATENT DOCUMENTS

| | | |
|---|---|---|
| 9,503,030 B2 | 11/2016 | Blednov |
| 9,543,914 B2 | 1/2017 | Bouny |
| 9,621,115 B1 | 4/2017 | Wu |
| 2018/0248521 A1 | 8/2018 | Min et al. |
| 2019/0020314 A1 | 1/2019 | Jones et al. |
| 2019/0165740 A1* | 5/2019 | McLaren .............. H03F 1/0288 |
| 2020/0186097 A1 | 1/2020 | Hue et al. |
| 2021/0391829 A1* | 12/2021 | Srinidhi Embar ...... H03F 3/245 |
| 2022/0021343 A1* | 1/2022 | Hue ......................... H03F 1/42 |
| 2022/0123693 A1* | 4/2022 | Wang ..................... H03F 3/195 |

OTHER PUBLICATIONS

U.S. Appl. No. 16/563,743; not yet published; 100 pages, filed Sep. 6, 2019.

\* cited by examiner

INTEGRATED MULTIPLE-PATH POWER AMPLIFIER

CROSS-REFERENCE TO RELATED APPLICATION

This application claims the priority under 35 U.S.C. § 119 of European patent application no. 19306623.0, filed Dec. 10, 2019 the contents of which are incorporated by reference herein.

TECHNICAL FIELD

Embodiments of the subject matter described herein relate generally to multiple-path power amplifiers, and more particularly to multiple-path power amplifiers with output combining circuits.

BACKGROUND

For many years, the Doherty power amplifier (PA) has been one of the most popular amplifiers for cellular infrastructure applications. Because the Doherty PA is well suited to amplifying signals with high peak-to-average power ratios (PAPRs), the prolific use of the Doherty PA is expected to continue for upcoming 5G infrastructure deployments. However, although the Doherty PA has been used for many years, conventional Doherty PA configurations are not able to meet some of the new challenges associated with 5G deployments. These challenges include supporting communications over increasingly broad bandwidths using low-cost and increasingly-compact amplifier equipment, all while meeting stringent RF performance requirements regarding linearity, efficiency and power gain.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
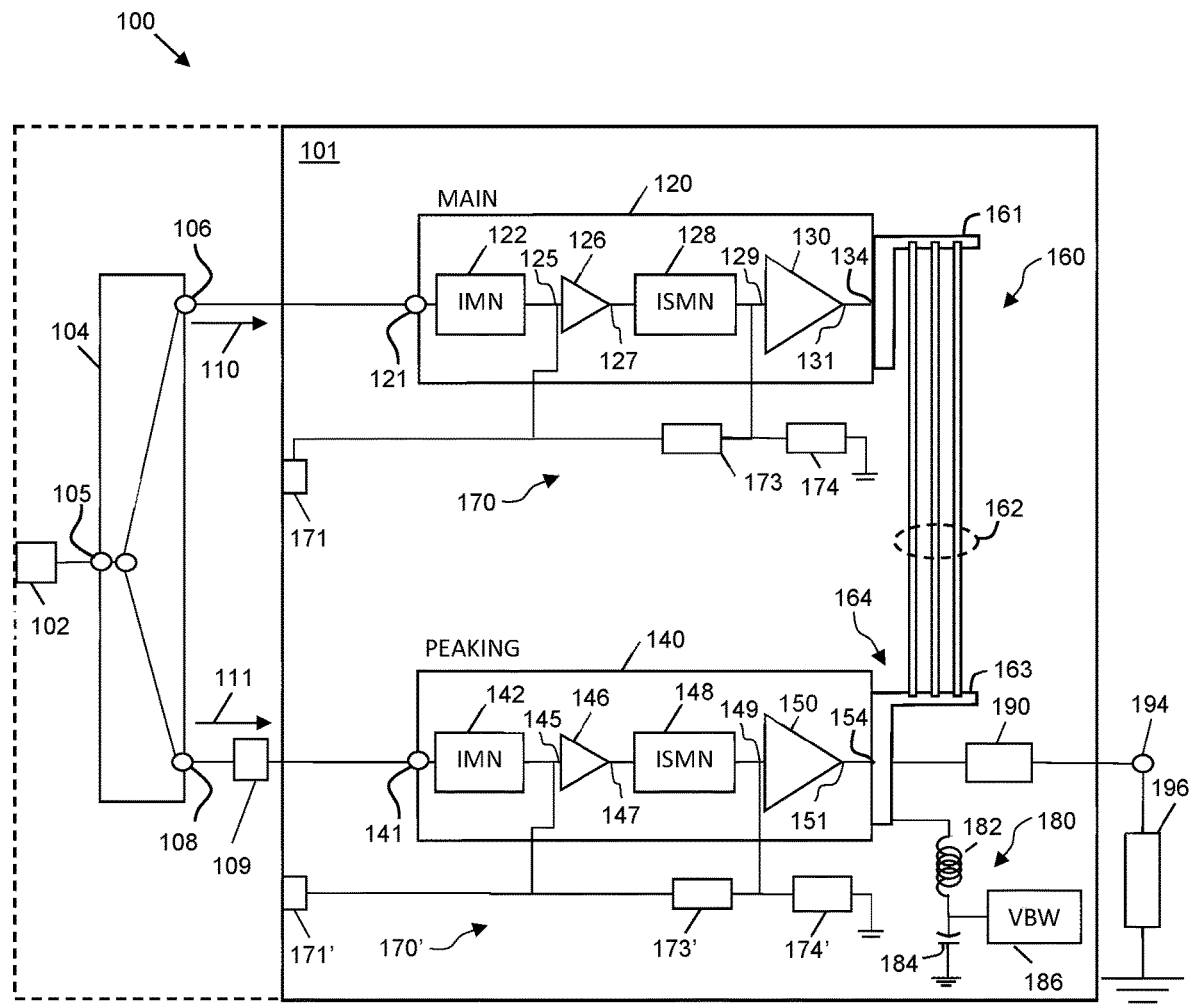
FIG. 1 is a simplified schematic of an integrated Doherty power amplifier, in accordance with an example embodiment.

An embodiment of a multiple-path amplifier includes a semiconductor die, a first transistor integrally-formed with the semiconductor die and having a first output terminal, a second transistor integrally-formed with the semiconductor die and having a second output terminal and a combining node, and an integrated phase delay circuit. A first signal path through the first transistor extends in a first direction from a control terminal of the first transistor to the first output terminal, and a second signal path through the second transistor extends in a second direction from a control terminal of the second transistor to the second output terminal. The second output terminal corresponds to or is closely electrically coupled to the combining node. The integrated phase delay circuit is configured to apply an overall phase delay to a signal carried between the first and second output terminals. The integrated phase delay circuit includes delay circuit wirebonds coupled between the first and second output terminals, and the delay circuit wirebonds extend in a third direction that is angularly offset from the second direction.

According to a further embodiment, the overall phase delay is 90 degrees, and the delay circuit wirebonds are configured to apply 30 degrees to 80 degrees of the overall phase delay. According to another further embodiment, the integrated phase delay circuit further includes the first output terminal, and the second output terminal. According to another further embodiment, the first output terminal has an elongated first bondpad with a first length that extends parallel with the first direction of the first signal path, and the delay circuit wirebonds are connected in parallel along the first length of the elongated first bondpad. According to another further embodiment, the first output terminal also includes an elongated conductive structure that is electrically coupled to the elongated first bondpad, where the elongated conductive structure has a second length that extends perpendicular to the first direction, and the elongated conductive structure is closely electrically coupled to a drain manifold of the first transistor. According to another further embodiment, the second output terminal has an elongated second bondpad with a second length that extends parallel with the second direction of the second signal path, and the delay circuit wirebonds are connected in parallel along the second length of the elongated second bondpad. According to another further embodiment, the elongated first bondpad and the elongated second bondpad are arranged in parallel. According to another further embodiment, the second output terminal also includes an elongated third bondpad that is electrically coupled to the elongated second bondpad, where the elongated third bondpad has a third length that extends perpendicular to the second direction, and the elongated third bondpad is closely electrically coupled to a drain manifold of the second transistor. According to another further embodiment, the first length and the second length are in a range between 200 microns and 400 microns, and the third length is in a range between 800 microns and 1800 microns.

According to another further embodiment, a set of output signal wirebonds is connected to the elongated third bondpad and extends in the second direction. According to another further embodiment, the multiple-path amplifier also includes a shunt-inductance circuit electrically coupled between the combining node and a ground reference node, wherein the shunt-inductance circuit includes a shunt inductance that is integrated with the semiconductor die. According to another further embodiment, the shunt-inductance circuit includes a first integrated inductance that includes a set of wirebonds, and a second integrated inductance that includes one or more spiral inductors that are integrally-formed with the semiconductor die, where the first and second integrated inductances are coupled in series between the combining node structure and the ground reference node. According to another further embodiment, the shunt-inductance circuit further includes a capacitor electrically connected in series with the first and second integrated inductances. According to another further embodiment, a video bandwidth circuit is electrically coupled between the second output terminal and a ground reference node. According to another further embodiment, the semiconductor die comprises a base semiconductor substrate having bulk resistivity in a range of about 1000 ohm/centimeter (cm) to about 100,000 ohm/cm or greater.

According to another further embodiment, the multiple-path amplifier is a Doherty power amplifier, and the first transistor is a main amplifier transistor, and the second transistor is a peaking amplifier transistor. According to another further embodiment, a signal splitter is integrated with the semiconductor die, where the signal splitter is configured to divide power of an input radio frequency (RF) signal into a main input signal that is provided to the main amplifier transistor and a peaking input signal that is provided to the peaking amplifier transistor.

An embodiment of a method of making a multiple-path amplifier includes integrally-forming a first transistor and a second transistor with a semiconductor die. The first transistor has a first output terminal, and a first signal path through the first transistor extends in a first direction from a control terminal of the first transistor to the first output terminal. The second transistor has a second output terminal and a combining node, where the second output terminal corresponds to or is closely electrically coupled to the combining node. A second signal path through the second transistor extends in a second direction from a control terminal of the second transistor to the second output terminal. The method further includes forming an integrated phase delay circuit by coupling delay circuit wirebonds between the first and second output terminals, where the delay circuit wirebonds extend in a third direction that is angularly offset from the second direction, and the integrated phase delay circuit is configured to apply an overall phase delay to a signal carried between the first and second output terminals.

According to a further embodiment, integrally-forming the first transistor includes forming the first output terminal to include an elongated first bondpad, and integrally-forming the second transistor includes forming the second output terminal to include an elongated second bondpad with a length that extends parallel with the second direction of the second signal path. The elongated first bondpad and the elongated second bondpad are arranged in parallel. According to another further embodiment, forming the integrated phase delay circuit includes connecting the delay circuit wirebonds between the elongated first bondpad and the elongated second bondpad.

In some typical conventional Doherty amplifiers, distinct semiconductor dies used for the main and peaking amplifiers are packaged in a discrete power amplifier device, and the discrete power amplifier device is coupled to a printed circuit board (PCB) that includes other portions of the Doherty amplifier. For example, an input splitter on the PCB is used to divide an input radio frequency (RF) signal into main and peaking input signals, and the main and peaking input signals are supplied to the main and peaking amplifiers through input leads of the power amplifier device. On the output side of the Doherty amplifier, amplified main and peaking signals are provided by the power amplifier device through separate output leads. Depending on whether the Doherty amplifier has a non-inverted or an inverted configuration, a phase delay and impedance inverter circuit (referred to simply as a "phase delay circuit") is coupled to the PCB along the main or peaking output path. At the output of the phase delay circuit, the amplified main and peaking signals are combined together by a Doherty combiner implemented on the PCB. In a mass production environment, various performance issues arise for conventional Doherty amplifiers due to placement tolerances for main and peaking power amplifier dies, variation in wirebond lengths and heights within the devices, and variations in the structures used to implement the phase delay circuit and the combiner at the PCB level.

Embodiments of the inventive subject matter include a monolithic multiple-path amplifier, and in more specific embodiments, a monolithic Doherty power amplifier, with integrated first and second (e.g., main and peaking) power transistors, an integrated phase delay and impedance inverter circuit, and an integrated signal combiner connected between the output terminals (e.g., drain terminals) of the first and second power transistors. More specifically, the phase delay circuit and the signal combiner are implemented with conductive structures and wirebonds that are integrated with the same die as the first and second power transistors. As used herein, the term "monolithic" means integrated with or within a single semiconductor die (e.g., die 201, FIGS. 2, 3). When a component is referred to herein as being "integrally-formed" with a die (e.g., die 201, FIGS. 2, 3), this means that the component structure forms a portion of the die itself (e.g., the component is created during the die fabrication process, and is physically located between the top and bottom surfaces of the die). For example, referring briefly to FIGS. 2 and 3, FETs 226, 230, 246, 250, inductors 282', 282", and capacitor 284 are considered to be "integrally-formed" with die 201. In contrast, when a component is referred to as being "integrated" with a die, this means that the component structure either is "integrally-formed" with the die, or the component is attached to the die (e.g., to the surface of die 201) in a self-contained manner. For example, the sets of wirebonds 262, 282 (where "set" means one or more) are considered to be "integrated" with die 201, as that term is used herein, because each wirebond in the sets of wirebonds 262, 282 launch and land on the top surface of the die 201 (i.e., both ends of each wirebond are bonded to different bonding pads on the die top surface, and thus each wirebond is "self-contained" within the die 201). In contrast, the sets of wirebonds 219, 290 are not considered to be "integrated" with die 201, because the wirebonds in the sets of wirebonds 219, 290 do not launch and land on the die 201 (i.e., only one end of each wirebond is bonded to a bonding pad on the die top surface). In addition, discrete components coupled to the top surface of a die also are considered to be "integrated" with the die (e.g., passive or active components that are discretely packaged with input and output terminals that are physically and electrically attached to bondpads exposed at the surface of a die, such as with solder or conductive adhesive).

As mentioned above, an embodiment of a Doherty amplifier includes an integrated signal combiner (or combining node structure) connected between outputs of main and peaking power transistors. In some embodiments, the signal combiner is closely electrically coupled to the drain terminal of the peaking transistor, where "closely electrically coupled," as used herein, means directly connected or electrically coupled through one or more conductive features (e.g., integrated conductive trace(s) or via(s)) that form a conductive path which has a negligible total electrical resistance (e.g., less than 5.0 ohms-20 ohms) and which is devoid of passive or active electrical components (e.g., discrete or integrated resistors, inductors, capacitors, or transistors).

Because the signal combiner may be implemented very close to the drain(s) of the peaking amplifier(s), a 90-0 Doherty amplifier may be achieved. The 90-degree phase difference between the main and peaking amplifier outputs is provided by a simulated quarter wave transmission line having a capacitor-inductor-capacitor (CLC) topology. The CLC topology includes the drain-source capacitances of the main and peaking transistors, in combination with a tightly-controllable inductance implemented between the main amplifier output and the Doherty combining structure. In addition, according to various embodiments, implementation of an on-die shunt-inductance (or shunt-L) circuit may effectively compensate for the otherwise potentially performance-limiting, parasitic drain-source capacitance of the peaking amplifier transistor.

Further still, the various embodiments may significantly reduce or eliminate device-to-device production variation associated with die placement, and also may enable reductions in wirebond length and height variations. Accordingly, implementation of the various embodiments may enable Doherty amplifiers with more consistent RF performance to be produced.

The below-described and illustrated embodiments of Doherty amplifier dies correspond to two-way Doherty amplifiers that include a main amplifier and one peaking amplifier. Although not explicitly illustrated, other embodiments may include "N-way" Doherty power amplifiers, where N>2, and in which the number of peaking amplifiers equals N−1. In addition, although the below-described example embodiments specifically pertain to embodiments of Doherty power amplifiers, the inventive subject matter may more generally apply to any type of multiple-path amplifier that may benefit from implementation of the inventive circuits and structures described herein. Therefore, the inventive subject matter is not limited to application only in Doherty power amplifiers.

FIG. 1 is a simplified schematic of a multiple-path Doherty power amplifier 100, in accordance with an example embodiment. Doherty amplifier 100 includes an input node 102, an output node 194, a power splitter 104 (or divider), a main amplification path 110, a peaking amplification path 111, an integrated phase delay and impedance inverter circuit 160 (referred to simply as a "phase delay circuit," below), a combining node structure 164, and an output shunt-L circuit 180. A load 196 may be coupled to the combining node structure 164 (e.g., through inductance 190 and output node 194) to receive an amplified RF signal from amplifier 100.

Figure 2:
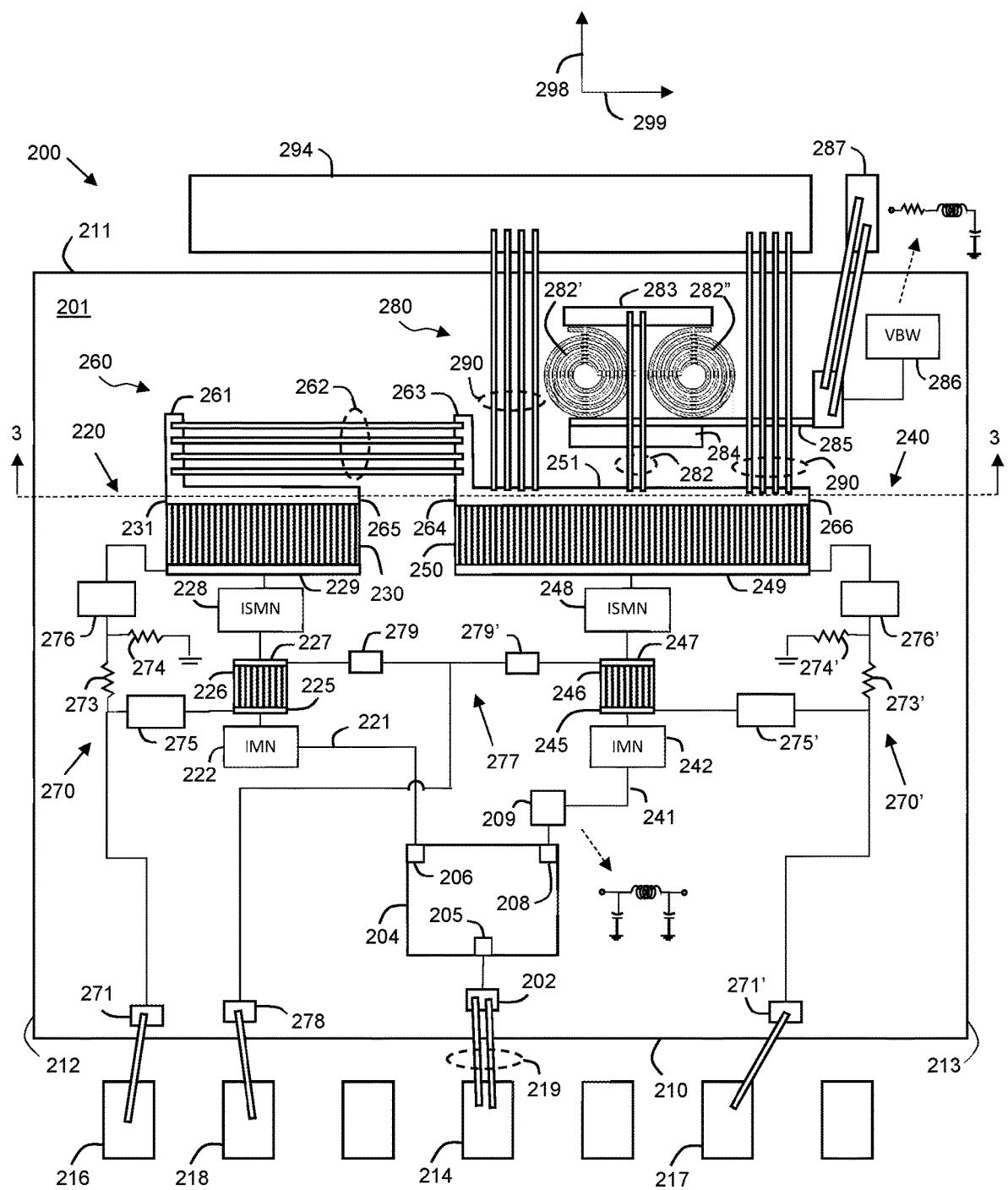
FIG. 2 is a top view of a Doherty power amplifier die, in accordance with an example embodiment.

According to an embodiment, at least the main amplification path 110, peaking amplification path 111, phase delay circuit 160, and combining node structure 164 are integrated with or within a single integrated circuit die 101 (i.e., the circuitry is monolithic). In some further embodiments, the output shunt-L circuit 180 also is integrated with the die 101. The power splitter 104 may be implemented on-die or off-die, in various embodiments. An off-die implementation is indicated by the solid rectangular box that excludes power splitter 104, but encloses the amplification paths 110, 111, phase delay circuit 160, and combining node structure 164. In off-die embodiments, the outputs 106, 108 of the power splitter 104 may be electrically connected to main and peaking path inputs 121, 141, respectively. In other embodiments, and as depicted in FIG. 2, discussed later, the power splitter 104 (e.g., power splitter 204, FIG. 2) alternatively may be integrated with the die 101 with the amplification paths 110, 111, phase delay circuit 160, and combining node structure 164, as indicated by the dashed rectangular box enclosing the power splitter 104.

Doherty power amplifier 100 is considered to be a "two-way" Doherty power amplifier, which includes one main amplifier 120 and one peaking amplifier 140. The main amplifier 120 provides amplification along the main amplification path 110, and the peaking amplifier 140 provides amplification along the peaking amplification path 111. In other embodiments, more than one peaking amplifier may be implemented in parallel with the first peaking amplifier 140 to produce an N-way Doherty power amplifier, where N>2, and the number of peaking amplifiers equals N−1.

Although the main and peaking amplifiers 120, 140 may be of equal size (e.g., in a symmetric Doherty configuration with a 1:1 main-to-peaking size ratio), the main and peaking amplifiers 120, 140 may have unequal sizes, as well (e.g., in various asymmetric Doherty configurations). In an asymmetric two-way Doherty amplifier configuration, the peaking power amplifier 140 typically is larger than the main power amplifier 120 by some multiplier. For example, the peaking power amplifier 140 may be twice the size of the main power amplifier 120 so that the peaking power amplifier 140 has twice the current carrying capability of the main power amplifier 120. Asymmetric main-to-peaking amplifier size ratios other than a 1:2 ratio may be implemented, as well.

Power splitter 104 is configured to divide the power of an input RF signal received at input node 102 into main and peaking portions of the input signal. The main input signal is provided to the main amplification path 110 at power splitter output 106, and the peaking input signal is provided to the peaking amplification path 111 at power splitter output 108. During operation in a low-power mode when only the main amplifier 120 is supplying current to the load 196, the power splitter 104 provides the input signal power only to the main amplification path 110. During operation in a full-power mode when both the main and peaking amplifiers 120, 140 are supplying current to the load 196, the power splitter 104 divides the input signal power between the amplification paths 110, 111.

Power splitter 104 may divide the power of the input RF signal equally or unequally. For example, when Doherty amplifier 100 has an asymmetric Doherty amplifier configuration in which the peaking amplifier 140 is approximately twice the size of the main amplifier 120 (i.e., the Doherty amplifier 100 has an asymmetric configuration with a 1:2 main-to-peaking size ratio), the power splitter 104 may divide the power such that roughly one third of the input signal power is provided to the main amplification path 110, and roughly two thirds of the input signal power is provided to the peaking amplification path 111. In other words, with a 1:2 main-to-peaking size ratio, the size of the peaking amplifier 140 is about twice the size of the main amplifier 120, and the power splitter 104 is configured to produce a peaking input signal with about twice the power of the main input signal.

Alternatively, in the case of a symmetric Doherty amplifier configuration (i.e., the main-to-peaking size ratio is about 1:1), the power splitter 104 may divide the power so that about half of the input signal power is provided to the main amplification path 110 at power splitter output 106, and about half of the input signal power is provided to the peaking amplification path 111 at power splitter output 108.

Essentially, the power splitter 104 divides an input RF signal supplied at the input node 102, and the divided signals are separately amplified along the main and peaking amplification paths 110, 111. The amplified signals are then combined in phase at the combining node structure 164. It is important that phase coherency between the main and peaking amplification paths 110, 111 is maintained across a frequency band of interest (or operational frequency band) to ensure that the amplified main and peaking signals arrive in phase at the combining node structure 164, and thus to ensure proper Doherty amplifier operation. In the Doherty amplifier configuration depicted in FIG. 1 (i.e., a non-inverted Doherty configuration, as described below), an input phase delay circuit 109 is coupled between power splitter output 108 and peaking amplifier input 141. According to an embodiment, the input phase delay circuit 109 applies about 90 degrees of phase delay to the peaking input signal before it is provided to the peaking amplifier 140. For example, the input phase delay circuit 109 may include a quarter wave transmission line, a lumped-element delay circuit, or another suitable type of delay element or circuit with an electrical length of about 90 degrees. In other embodiments, the 90 degree signal delay may be applied by the splitter 104, and the input phase delay circuit 109 may be excluded.

Each of the main amplifier 120 and the peaking amplifier 140 includes a single power transistor or multiple cascaded power transistors for amplifying an RF signal conducted through the amplifier 120, 140. As used herein, the term "transistor" means a field effect transistor (FET) or another type of suitable transistor. For example, a "FET" may be a metal-oxide-semiconductor FET (MOSFET), a laterally-diffused MOSFET (LDMOS FET), an enhancement-mode or depletion-mode high electron mobility transistor (HEMT), or another type of FET. According to various embodiments, each of the power transistors in the main and peaking amplifiers 120, 140 may be implemented, for example, using a silicon-based FET (e.g., an LDMOS FET), a silicon-germanium (SiGe) based FET, or a III-V FET (e.g., a HEMT), such as a gallium nitride (GaN) FET (or another type of III-V transistor, including a gallium arsenide (GaAs) FET, a gallium phosphide (GaP) FET, an indium phosphide (InP) FET, or an indium antimonide (InSb) FET).

According to an embodiment, the main amplifier 120 is a two-stage amplifier, which includes a relatively low-power pre-amplifier 126 and a relatively high-power final-stage amplifier 130 connected in a cascade arrangement between main amplifier input 121 and main amplifier output 134. In the main amplifier cascade arrangement, an output 127 of the pre-amplifier 126 is electrically coupled to an input 129 of the final-stage amplifier 130. Similarly, the peaking amplifier 140 is a two-stage amplifier, which includes a relatively low-power pre-amplifier 146 and a relatively high-power final-stage amplifier 150 connected in a cascade arrangement between a peaking amplifier input 141 and a peaking amplifier output 154. In the peaking amplifier cascade arrangement, an output 147 of the pre-amplifier 146 is electrically coupled to an input 149 of the final-stage amplifier 150. In other embodiments, each of the main amplifier 120 and the peaking amplifier 140 may be a single-stage amplifier, or may include more than two, cascade-coupled amplification stages. Input impedance matching networks 122, 142 (IMN) and inter-stage impedance matching networks 128, 148 (ISMN) may be implemented, respectively, at the input 125, 145 of each pre-amplifier 126, 146 and between each pre-amplifier 126, 146 and each final-stage amplifier 130, 150. In each case, the matching networks 122, 142, 128, 148 may incrementally increase the circuit impedance toward the load impedance.

During operation of Doherty amplifier 100, the main amplifier 120 is biased to operate in class AB mode, and the peaking amplifier 140 typically is biased to operate in class C mode. In some configurations, the peaking amplifier 140 may be biased to operate in class B or deep class B modes. At low power levels, where the power of the input signal at node 102 is lower than the turn-on threshold level of peaking amplifier 140, the amplifier 100 operates in a low-power mode in which the main amplifier 120 is the only amplifier supplying current to the load 196. When the power of the input signal exceeds a threshold level of the peaking amplifier 140, the amplifier 100 operates in a high-power mode in which the main amplifier 120 and the peaking amplifier 140 both supply current to the load 196. At this point, the peaking amplifier 140 provides active load modulation at combining node structure 164, allowing the current of the main amplifier 120 to continue to increase linearly.

As will be explained in more detail in conjunction with FIG. 2, later, gate biasing of the main and peaking amplifiers 120, 140 may be performed using one or more resistor-divider gate bias circuits 170, 170' (e.g., resistor-divider gate bias circuits 270, 270', FIG. 2), in an embodiment, where each resistor-divider gate bias circuit 170, 170' includes at least one resistor 173, 174, 173', 174' electrically coupled between a gate bias voltage input 171, 171' and an input 125, 129, 145, 149 (e.g., a gate terminal) of each amplifier 126, 130, 146, 150. Drain biasing of the pre-amplifiers 126, 146 also may be performed with a drain bias circuit (not shown in FIG. 1, but shown in FIG. 2 as circuit 277).

A shunt-L circuit 180 is coupled between the output 154 of the peaking amplifier 140 and a ground reference (or ground reference node), in an embodiment. As mentioned previously, the shunt-L circuit 180 is configured to compensate for the drain-source capacitance at the output 151 of the peaking final-stage amplifier 150. In an embodiment, the shunt-L circuit 180 includes an inductance 182 and a capacitance 184 coupled in series between the output 154 of the peaking amplifier 140 and a ground reference.

In addition, embodiments of the inventive subject matter may include a video bandwidth (VBW) circuit 186 coupled between the output 154 of the peaking amplifier 140 and a ground reference. In a more specific embodiment, a VBW circuit 186 is coupled to a node (e.g., an "RF cold point" node, or some other node) between the inductance 182 and the capacitance 184 of the shunt-L circuit 180. As used herein, an "RF cold point" node is a conductive node that may function as a virtual ground reference voltage for RF electrical signals. The components of the VBW circuit 186 may be integrated with die 101, or the components of the VBW circuit 186 may be implemented off chip, in various embodiments. Either way, the VBW circuit 186 is configured to improve the low frequency resonance (LFR) of amplifier 100 caused by the interaction between various circuitry and structures of the amplifier 100 by presenting a low impedance at envelope frequencies and/or a high impedance at RF frequencies. The VBW circuit 186 essentially may be considered to be "invisible" from an RF matching standpoint, as it primarily effects the impedance at envelope frequencies (i.e., VBW circuit 186 provides a termination for signal energy at the envelope frequencies of amplifier 100).

The VBW circuit 186 may have any of a number of configurations. In some embodiments, the VBW circuit 186 includes a series circuit of a resistor, an inductor, and a capacitor coupled between the peaking amplifier output 154 (or some other point along an amplification path 110, 111) and the ground reference. Although the VBW circuit 186 is shown to be coupled to a particular node in FIG. 1, the VBW circuit 186 could be coupled to another node, or multiple VBW circuits could be coupled to multiple points along each amplification path 110, 111. For example, a VBW circuit 186 could be coupled between any output 127, 147 of a pre-amplifier 126, 146 and a ground reference, or a VBW circuit 186 could be coupled between any output 131, 151 of a final-stage amplifier 130, 150 and the ground reference, or a VBW circuit 186 could be coupled between any input 125, 145 of a pre-amplifier 126, 146 and the ground reference.

Doherty amplifier 100 has a "non-inverted" load network configuration. In the non-inverted configuration, the input circuit is configured so that the input signals supplied to the peaking amplifier 140 are delayed by 90 degrees with respect to the input signal supplied to the main amplifier 120 at the center frequency of operation, fo, of the amplifier 100. To ensure that the main and peaking input RF signals arrive at the main and peaking amplifiers 120, 140 with about 90 degrees of phase difference, as is fundamental to proper Doherty amplifier operation, input phase delay circuit 109 applies about 90 degrees of phase delay to the peaking input signal before it is provided to the peaking amplifier 140, as described above.

The 90 degree phase delay difference between the main and peaking amplification paths 110, 111 at the inputs of amplifiers 120, 140 compensates for a 90 degree phase delay applied to the signal by the phase delay circuit 160 between the output of main amplifier 120 and the combining node structure 164. In addition, the phase delay circuit 160 imparts an impedance inversion to the amplified RF signal along the main amplification path 110. The phase delay circuit 160 includes multiple components 161, 162, 163 connected in series. According to an embodiment, the components 161-163 include a combination of specially-configured amplifier output terminals 161, 163 connected through wirebonds 162, as will be discussed in more detail in conjunction with FIGS. 2 and 3.

Alternate embodiments of Doherty amplifiers may have an "inverted" load network configuration. In such a configuration, the amplifier is configured so that an input signal supplied to the main amplifier 120 is delayed by about 90 degrees with respect to the input signal supplied to the peaking amplifier 140 at the center frequency of operation, f0, of the amplifier 100, and an output phase delay circuit is configured to apply about a 90 degree phase delay and impedance inversion to the signal between the output of the peaking amplifier 140 and the combining node structure.

Figure 3:
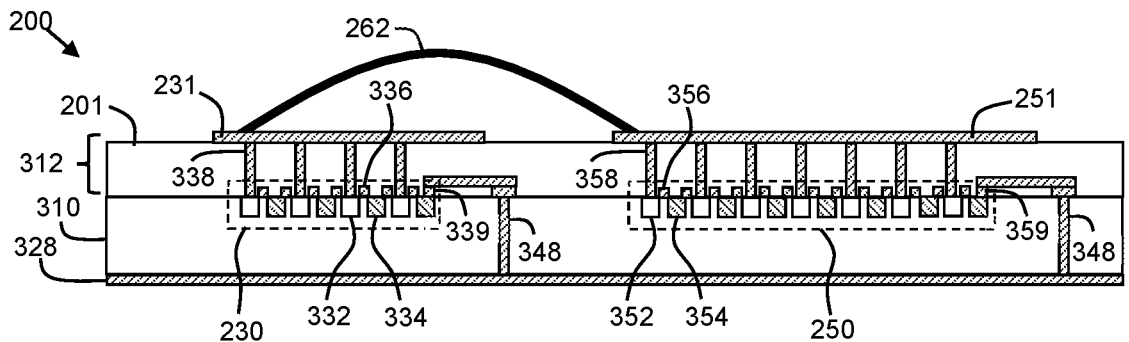
FIG. 3 is a side, cross-sectional view of the Doherty amplifier die of FIG. 2 along line 3-3, in accordance with an example embodiment.

Doherty amplifier 100 is "integrated," as that term is used herein, because at least the main amplifier 120 (e.g., including the pre-amplifier 126 and the final-stage amplifier 130), the peaking amplifier 140 (including the pre-amplifier 146 and the final-stage amplifier 150), the phase delay circuit 160, and the combining node structure 164 are integrated with or within one single IC die 101 (e.g., die 201, FIGS. 2, 3), which may be referred to herein as an "integrated Doherty amplifier die." According to an embodiment, all or portions of the input and inter-stage impedance matching networks 122, 142, 128, 148 also may be integrated with or within the same IC die 101 (e.g., die 201, FIGS. 2, 3). Further, the splitter 104 may be integrated with or within the same IC die 101 (e.g., die 201, FIG. 2). Alternatively, all or portion of the splitter 104 and/or input impedance matching networks 122, 142 may be implemented in one or more components that are distinct from the IC die that includes the main and peaking amplifiers 120, 140. According to another further embodiment, the resistor-divider bias circuits 170, 170' also are integrated with or within the same IC die 101 (e.g., die 201, FIGS. 2, 3) as the main and peaking amplifiers 120, 140, although biasing may be performed by non-integrated circuits and structures in other embodiments. According to yet another further embodiment, the VBW circuit 186 also is integrated with or within the same IC die 101 (e.g., die 201, FIGS. 2, 3) as the main and peaking amplifiers 120, 140, although the VBW circuit 186 may be implemented using non-integrated circuits and structures in other embodiments.

FIG. 2 is a top view of an example embodiment of a Doherty power amplifier die 200 (or "Doherty IC"). For enhanced understanding, FIG. 2 should be viewed simultaneously with FIG. 3, which is a side, cross-sectional view of the Doherty IC 200 of FIG. 2 along line 3-3. It should be noted that the same elements in FIGS. 2 and 3 are indicated using the same reference numbers. As used herein, the terms "integrated circuit die" and "IC die" mean a single, distinct semiconductor die (or semiconductor substrate) within which one or more circuit components (e.g., transistors, passive devices, and so on) are integrally-formed and/or directly physically connected to produce a monolithic structure.

Doherty IC 200 includes portions of an entire Doherty amplifier (e.g., Doherty amplifier 100, FIG. 1) integrated with or within a single semiconductor die 201, where the semiconductor die has a substantially rectangular periphery defined by opposed input and output sides 210/211 (e.g., bottom and top sides in the orientation of FIG. 2) and opposed left and right sides 212/213 that extend between the input and output sides. Referring to the coordinate legend at the top of FIG. 2, which indicates orthogonal directions 298, 299, the left and right sides 212, 213 are parallel with direction 298, and the input and output sides 210, 211 are parallel with direction 299. The overall direction of the signal path through the die 201 is parallel with direction 298 (i.e., in a direction between input terminal 202 and output lead 298). In addition, the directions of the signal paths through the transistors 226, 230, 246, 250 also are parallel with direction 298 (i.e., in directions between each respective gate terminal 225, 229, 245, 249 and drain terminal 227, 231, 247, 251). The circuitry within die 201 is electrically connected to external circuitry through leads (e.g., leads 214, 216, 217, 218, 287, 294) that are positioned adjacent to the input and output sides 210/211 of the die 201, and through wirebonds (e.g., wirebonds 219, 290) connected between the leads and bondpads (e.g., bondpads 202, 271, 271', 278, 285) on the die 201.

In the specific embodiment illustrated in FIG. 2, Doherty amplifier die 200 includes the following circuitry integrated with or within semiconductor die 201: a two-stage main amplifier 220 (e.g., main amplifier 120, FIG. 1), a two-stage peaking amplifier 240 (e.g., peaking amplifier 140, FIG. 1), a phase shift/impedance inverter circuit 260 (e.g., phase shift/impedance inverter 160, FIG. 1), a combining node structure 264 (e.g., combining node structure 164, FIG. 1), resistor-divider bias circuits 270, 270' (e.g., resistor-divider bias circuits 170, 170', FIG. 1), a drain bias circuit 277, and a shunt-L circuit 280 (e.g., shunt-L circuit 180, FIG. 1). The Doherty IC 200 of FIG. 2 further includes a power splitter 204 (e.g., power splitter 104, FIG. 1), and an input phase delay circuit 209 (e.g., input phase delay circuit 109, FIG. 1).

As seen most clearly in FIG. 3, semiconductor die 201 includes a base semiconductor substrate 310 and a plurality of build-up layers 312 over a top surface of the base semiconductor substrate 310. In a particular example embodiment, the base semiconductor substrate 310 is a high-resistivity silicon substrate (e.g., a silicon substrate having bulk resistivity in a range of about 1000 ohm/centimeter (cm) to about 100,000 ohm/cm or greater).

Alternatively, the base semiconductor substrate 310 may be a semi-insulating gallium arsenide (GaAs) substrate (e.g., a GaAs substrate having bulk resistivity up to $10^8$ ohm/cm), or another suitable high-resistivity substrate. In still other alternate embodiments, the base semiconductor substrate 310 may be any of multiple variants of a GaN substrate or other III-V semiconductor substrates. An advantage to the use of a high-resistivity substrate is that such a substrate may enable various on-die circuitry (e.g., the on-die combining node structure 264 and other circuitry) to exhibit relatively low losses, when compared with amplifier dies that do not utilize a high-resistivity substrate.

The plurality of build-up layers 312 may include, for example, a plurality of interleaved dielectric layers, patterned conductive layers, and other conductive structures (e.g., conductive polysilicon structures). In the build-up layers 312, portions of different patterned conductive layers and structures are electrically coupled with conductive vias. Further, conductive through substrate vias (TSVs) (e.g., TSV 348) may provide conductive paths between the top and bottom surfaces of the base semiconductor substrate 310. The TSVs may or may not be lined with dielectric material to insulate the TSVs from the base semiconductor substrate 310. According to an embodiment, a conductive layer 328 on or at the bottom surface of the base semiconductor substrate 310 functions as a ground reference node for the Doherty IC 200. As used herein, a "ground reference node" means a conductive feature that is integrally-formed with the semiconductor die 201, and which is configured to be electrically coupled to an external conductive feature which, in turn, may be electrically coupled to a ground reference voltage source. Thus, although not shown in FIGS. 2, 3, when the Doherty IC 200 ultimately is packaged, the conductive layer 328 may be physically and electrically coupled to a ground node of a package substrate (e.g., flange 430, FIG. 4). In other embodiments, the "ground reference node" may be an integrally-formed conductive feature of die 201 other than conductive layer 328 (e.g., the ground reference node may be a bondpad, end(s) of one or more conductive vias, or other integrally-formed conductive features).

In the below description of the Doherty IC 200, reference will be made to various circuits that include capacitors, inductors, and/or resistors. The capacitors may be, for example, integrated metal-insulator-metal (MIM) capacitors (e.g., capacitor 284, FIG. 2) formed within the build-up layers (e.g., layers 312), discrete capacitors coupled to the top surface of the die 201, and/or other types of capacitors, in various embodiments. The resistors may be, for example, integrated resistors (e.g., formed from polysilicon within the build-up layers 312), or discrete resistors coupled to the top surface of the die 201. The inductors may be integrally-formed spiral inductors (e.g., spiral inductors 282', 282", FIG. 2) formed from patterned conductive layers and vias within the build-up layers (e.g., layers 312), or they may be discrete inductors or inductances formed from wirebonds (e.g., wirebonds 262, 290, FIGS. 2, 3), patterned conductive features (e.g., bondpads 261, 263, FIG. 2), or other inductive components.

In the embodiment of FIGS. 2, 3, each of the main amplifier 220 and the peaking amplifier 240 include a cascade arrangement of two power transistors, including a relatively low-power pre-amplifier transistor 226, 246 (e.g., pre-amplifiers 126, 146, FIG. 1) and a relatively high-power final-stage amplifier transistor 230, 250 (e.g., final-stage amplifiers 130, 150, FIG. 1). The description herein refers to each transistor as including a control terminal and two current-conducting terminals. For example, using terminology associated with FETs, a "control terminal" refers to a gate terminal of a transistor, and first and second current-conducting terminals refer to drain and source terminals (or vice versa) of a transistor. Although the below description may use terminology commonly used in conjunction with FET devices, the various embodiments are not limited to implementations the utilize FET devices, and instead are meant to apply also to implementations that utilize bipolar junction transistors (BJT) devices or other suitable types of transistors.

Each transistor 226, 230, 246, 250 includes a gate terminal 225, 229, 245, 249 (or control terminal), a drain terminal 227, 231, 247, 251 (or output terminal), and a source terminal, not numbered. In a specific embodiment, each transistor 226, 230, 246, 250 is an LDMOS FET, which includes an active area disposed between gate and drain terminals. Referring to the cross-section shown in FIG. 3, the active areas of FETs 230, 250 each include a plurality of elongated, parallel-aligned, and interdigitated drain regions 332, 352 (shown as unfilled boxes in cross-section in FIG. 3) and source regions 334, 354 (shown as cross-hatched boxes in cross-section in FIG. 3), where each drain region and each source region is a doped semiconductor region formed in the base semiconductor substrate (e.g., substrate 310). The drain regions 332 of FET 230 are electrically coupled together with first drain manifold, and similarly the drain regions 352 of FET 250 are electrically coupled together with second drain manifold. Each of the drain manifolds of FETs 230, 250 are closely electrically coupled to their respective drain terminals 231, 251 (or output terminals, or current-conducting terminals). Due to their elongated shapes, each set of adjacent drain and source regions, along with a gate structure 336, 356 overlying the channel region between the adjacent drain and source regions, may be referred to as a "transistor finger." Each transistor 226, 230, 246, 250 includes a plurality of parallel transistor fingers within the active area of the transistor (indicated with vertical lines in FIG. 2). As also indicated by the vertical lines in FIG. 2, the transistor fingers have a longest dimension that is parallel with direction 298.

Variably-conductive channel regions (and, in some embodiments, drain drift regions) are present between adjacent source regions 334, 354 and drain regions 332, 352. Conductive (e.g., polysilicon or metal) gate structures 336, 356, which are formed in the build-up layers 312 over the base semiconductor substrate 310, extend over and along the elongated channel regions, and the gate structures 336, 356 are coupled to each gate terminal 229, 249. Similarly, additional conductive (e.g., polysilicon or metal) drain contacts (not depicted in FIG. 3) formed over the base semiconductor substrate 310 extend along the elongated drain regions 332, 352 to conduct current between the drain regions 332, 352 and the respective drain manifolds. As mentioned above, the drain manifolds are closely electrically coupled to each drain terminal 231, 251 with additional conductive structures (represented simply with vias 338, 358). The source regions are electrically coupled to conductive (e.g., polysilicon or metal) source contacts (e.g., contacts 339, 359), which in turn are coupled to conductive TSVs (e.g., TSVs 348, FIG. 3) that extend through the base semiconductor substrate 310 to connect with a conductive layer 328 on the bottom surface of the base semiconductor substrate. Voltages applied to the gate terminals 225, 229, 245, 249 during operation modulate the conductivity of the variably-conductive channels, thus enabling current flow between source and drain regions (or ultimately between conductive layer 328 and each drain terminal 227, 231, 247, 251).

The circuitry integrated within and coupled to Doherty IC 200 will now be described in more detail. Doherty IC 200 includes an integrated power splitter 204 (e.g., power splitter 104, FIG. 1). More specifically, an input terminal 202 (e.g., input node 102, FIG. 1), which is configured to receive an input RF signal for amplification, is electrically connected to a splitter input 205 (e.g., input 105, FIG. 1) of power splitter 204 through a conductive path implemented in the build-up layers of the Doherty IC 200. Input terminal 202 may include, for example, a conductive bondpad, which is exposed at the top surface of the die 201, and which is configured for attachment of one or more wirebonds 219. Alternatively, die 201 may be a flip-chip die or the input terminal may be exposed at the bottom surface of the die 201, in which case the input terminal 202 may consist of a conductive land or other type of connection. These alternate configurations also may apply to the other terminals (e.g., terminals 271, 271', 278) of the Doherty IC 200.

The power splitter 204 (e.g., power splitter 104, FIG. 1) is configured to divide the power of an input RF signal received at input terminal 202 into main and peaking portions of the input signal. As described in conjunction with FIG. 1, power splitter 204 is configured to divide the power of the input RF signal received at input terminal 202 into one main portion of the input signal (or "main input signal") and one peaking portion of the input signal (or "peaking input signal". The main input signal is produced at power splitter output 206 (e.g., output 106, FIG. 1), and the peaking input signal is produced at power splitter output 208 (e.g., output 108, FIG. 1). As also discussed previously, the power splitter 204 may divide the power equally or unequally, depending on the relative sizes of the main amplifier 220 and the peaking amplifier 240. In the embodiment of FIGS. 2 and 3, the main amplifier 220 is about half the size of the peaking amplifier 240 (i.e., the final-stage amplifier FETs 230, 250 have a 1:2 size relationship, and the Doherty amplifier is an asymmetric amplifier with a 1:2 main-to-peaking ratio), and thus the power splitter 204 divides the input RF signal so that about one third of the input signal power is produced at power splitter output 206, and about two thirds of the input signal power is produced at power splitter output 208. In other embodiments, the main and peaking amplifiers 220, 240 may have a different asymmetric size relationship. In still other embodiments, the sizes of the main amplifier 220 and the peaking amplifier 240 may be equal (i.e., the final-stage amplifier FETs 230, 250 have a 1:1 size relationship, and the Doherty amplifier is a symmetric amplifier with a 1:1 main-to-peaking ratio), in which case the power splitter 204 may divide the power of the RF input signal into equal portions.

Input terminal 205 has a 50-ohm input impedance, in an embodiment, although the input impedance may be less or greater than 50 ohms, as well. According to an embodiment, the power splitter 204 has a Wilkinson-based design, which essentially divides the power of the input signal received at input 205 into two signals (i.e., a main input signal and a peaking input signal) with equal phase at outputs 206 and 208. In an alternate embodiment, power splitter 204 may divide the power of the input signal received at input 205 into two signals that are out of phase with each other (e.g., 90 degrees out of phase).

Output 206 of power splitter 204 is electrically connected to the input of the main amplifier 220 through a conductive path implemented in the build-up layers of the die 201. According to an embodiment, output 208 of power splitter 204 is electrically connected to the input of the peaking amplifier 240 through input phase delay circuit 209 (e.g., input phase delay circuit 109, FIG. 1) and additional conductive paths implemented in the build-up layers of the die 201. The input phase delay circuit 209 is configured to impart a delay to the peaking input signal to ensure that the peaking input signal at the input to the peaking amplifier 240 has about 90 degrees of phase difference from the main input signal at the input to the main amplifier 220. According to an embodiment, the input phase delay circuit 209 is implemented with integrated components, which as indicated by the circuit schematic next to circuit 209, may include a pi-configured phase delay circuit. For example, the phase delay circuit 209 may include an integrated inductor with a first terminal coupled to an output 208 of splitter 204, and a second terminal coupled to an input to the peaking amplifier 240, along with integrated shunt capacitors coupled between each inductor terminal and the ground reference. In an alternate embodiment, the input phase delay circuit 209 could be implemented using transmission lines (or wirebonds) having a suitable electrical length (e.g., about 90 degrees or a lesser amount that is sufficient to produce the desired phase delay) or using some other delay circuit structure or configuration.

Each of the main amplifier 220 and the peaking amplifier 240 may have a substantially similar configuration, in an embodiment. According to an embodiment, each amplifier 220, 240 is a two-stage amplifier, which includes a relatively low-power pre-amplifier 226, 246 (or pre-amplifier FET) and a relatively high-power final-stage amplifier transistor 230, 250 (or final-stage amplifier FET) connected in a cascade arrangement between an amplifier input 221, 241 and a combining node structure 264.

In the main amplifier 220, an input 221 of the amplifier 220 is coupled through an input impedance matching network 222 (e.g., IMN 122, FIG. 1) to an input terminal 225 (e.g., gate terminal) of pre-amplifier FET 226, and an output 227 (e.g., drain terminal) of the pre-amplifier FET 226 is electrically coupled through an inter-stage impedance matching network 228 (e.g., ISMN 128, FIG. 1) to an input terminal 229 (e.g., gate terminal) of final-stage amplifier FET 230. Similarly, in the peaking amplifier 240, an input 241 of the amplifier 240 is coupled through an input impedance matching network 242 (e.g., IMN 142, FIG. 1) to an input terminal 245 (e.g., gate terminal) of pre-amplifier FET 246, and an output 247 (e.g., drain terminal) of the pre-amplifier FET 246 is electrically coupled through an inter-stage impedance matching network 248 (e.g., ISMN 148, FIG. 1) to an input terminal 249 (e.g., gate terminal) of final-stage amplifier FET 250. The source terminals of each of FETs 226, 230, 246, 250 are electrically coupled to a ground reference (e.g., using TSVs 348 through the base semiconductor substrate 310 to the bottom conductive layer 328, FIG. 3).

The pre-amplifier FETs 226, 246 may be equal in size, in an embodiment, and may be configured to apply a gain to a respective input RF signal in a range of about 15 decibels (dB) to about 25 dB when the Doherty IC 200 is operating in a high-power mode (e.g., close to compression), although only pre-amplifier FET 226 provides gain to its input signal when the Doherty IC 200 is operating in a low-power mode. The final-stage amplifier FETs 230, 250 are significantly larger than the pre-amplifier FETs 226, 246 (e.g., at least twice as large to apply at least twice the gain). In an asymmetric configuration, as shown in FIGS. 2 and 3, the final-stage amplifier FETs 230, 250 differ in size. Specifically, the final-stage amplifier FET 250 of the peaking amplifier 240 is about twice the size of the final-stage amplifier FET 230 of the main amplifier 220, although the size ratio may be different, as well. Either way, each final-stage amplifier FET 230, 250 may be configured to apply a gain to a respective input RF signal in a range of about 15 dB to about 25 dB when the Doherty IC 200 is operating in a high-power mode (e.g., close to compression), although only final-stage amplifier FET 230 provides gain to its input signal when the Doherty IC 200 is operating in a low-power mode.

The outputs (i.e., drain manifolds and drain terminals 231, 251) of each of the final-stage amplifier FETs 230, 250 are electrically connected to combining node structure 264 (e.g., combining node structure 164, FIG. 1), which functions to combine the amplified RF signals produced by each of the final-stage amplifier FETs 230, 250 into a single amplified output RF signal. More specifically, the drain manifold and drain terminal 231 of the final-stage main amplifier FET 230 is electrically coupled to the combining node structure 264 (and to drain terminal 251 of the final-stage peaking amplifier FET 250) through a phase delay circuit 260 (e.g., circuit 160, FIG. 1). According to an embodiment, the phase delay circuit 260 essentially includes drain terminals 231, 251 and a set of wirebonds 262 coupled between the drain terminals 231, 251.

According to an embodiment, the drain terminal 231 of the final-stage main amplifier FET 230 is uniquely configured to enable a first set of wirebonds 262 (referred to as "delay circuit wirebonds") to be coupled to the drain terminal 231 in parallel with each other so that the delay circuit wirebonds 262 extend in a direction (e.g., direction 299) that is angularly offset from (e.g., perpendicular or orthogonal to) the direction of the signal path through the die 201, and more particularly to the direction of the signal path through the final-stage main amplifier FET 230. The perpendicular (or otherwise angularly offset) orientation of the delay circuit wirebonds 262 with respect to the direction of the signal path through the die 201 and transistor 230 may reduce electromagnetic coupling, during operation of device 200, between the signal conveyed through the delay circuit wirebonds 262 and the signal conveyed through transistor 230.

To enable the delay circuit wirebonds 262 to be connected to the drain terminal 231 as described above, the drain terminal 231 has a depth (i.e., vertical dimension in FIG. 2) that is large enough to enable the delay circuit wirebonds 262 to be coupled to the drain terminal 231 in the above-explained orthogonal orientation. In the embodiment depicted in FIG. 2, the drain terminal 231 includes an elongated, first conductive structure 265 (i.e., elongated along the dimension parallel to direction 299) that is directly connected to the drain regions of the final-stage main amplifier FET 230 (or closely electrically coupled to the drain manifold), and an elongated, bondpad 261, which is exposed at the top surface of die 201, and which is large enough to enable the plurality of delay circuit wirebonds 262 to be connected in parallel with each other along the length of the bondpad 261 (dimension parallel to direction 298). The conductive structure 265 and the bondpad 261 may be formed from a same conductive layer (including being integrally formed from the same conductive layer), or they may be distinct conductive features that are closely electrically coupled. In an embodiment, the long dimension of the first conductive structure 265 is perpendicular to the direction of the signal path through the die 201 and transistor 230, and is parallel to the direction of the delay circuit wirebonds 262. Conversely, the long dimension of the bondpad 261 is parallel to the direction of the signal path through the die 201 and transistor 230 and perpendicular to the direction of the delay circuit wirebonds 262.

The drain terminal 251 of the final-stage peaking amplifier FET 250 also includes a bondpad exposed at the top surface of die 201. According to an embodiment, the drain terminal 251 is uniquely configured to enable a second array or plurality of wirebonds 290 (referred to as "output signal wirebonds") to be coupled to the drain terminal 251 in parallel with each other so that the output signal wirebonds 290 extend in a first direction (e.g., direction 298), and to further enable the delay circuit wirebonds 262 to be coupled to the drain terminal 251 in parallel with each other so that the delay circuit wirebonds 262 extend in a second direction (e.g., direction 299) that is significantly angularly offset from (e.g., perpendicular to) the first direction. For example, the first and second directions may be orthogonal (i.e., offset by 90 degrees from each other), or the first and second directions may be angularly offset by a larger or smaller angle than 90 degrees (e.g., an angle in a range of about 30 degrees to about 150 degrees). In an embodiment, and as shown in FIG. 2, the first direction of the output signal wirebonds 290 may be parallel with the direction of the signal path through the die 201, and more particularly the direction of the signal path through the final-stage peaking amplifier FET 250 (e.g., direction 298), and the second direction of the delay circuit wirebonds 262 may be perpendicular to the direction of the signal path through the die 201, and more particularly the direction of the signal path through the final-stage peaking amplifier FET 250.

To enable the first and second wirebonds 290, 262 to be connected to the drain terminal 251 as described above, the drain terminal 251 has a width (i.e., horizontal dimension in FIG. 2) and a depth (i.e., vertical dimension in FIG. 2) that are large enough to enable the output signal and delay circuit wirebonds 290, 262 to be coupled to the drain terminal 251 in an orthogonal manner with respect to each other. In the embodiment depicted in FIG. 2, the drain terminal 251 includes an elongated, first bondpad 266 that is directly connected to the drain regions of the final-stage peaking amplifier FET 250, and that is large enough to enable the plurality of output signal wirebonds 290 to be connected in parallel with each other along the length of the first bondpad 266 (horizontal dimension parallel to direction 299). The drain terminal 251 also includes an elongated, second bondpad 263 that is large enough to enable the plurality of delay circuit wirebonds 262 to be connected in parallel with each other along the length of the second bondpad 263 (vertical dimension parallel to direction 298). The bondpads 263, 266 may be formed from a same conductive layer (including being integrally formed from the same conductive layer), or they may be distinct conductive features that are closely electrically coupled. In an embodiment, the long dimension of the first bondpad 266 is perpendicular to the direction of the signal path through the die 201 and transistor 250, and also is perpendicular to the direction of the output signal wirebonds 290. Conversely, the long dimension of the second bondpad 263 is parallel to the direction of the signal path through the die 201 and transistor 250 and perpendicular to the direction of the delay circuit wirebonds 262.

Accordingly, the direction of the delay circuit wirebonds 262 (i.e., direction 299) is perpendicular (or orthogonal) to the direction of the signal path through the die 201 and transistor 250 (i.e., direction 298), and also is perpendicular to the direction of the output signal wirebonds 290. The perpendicular (or otherwise angularly offset) orientation of the delay circuit wirebonds 262 with respect to the direction of the signal path through the die 201 and transistor 250 and the direction of the output signal wirebonds 290 may reduce electromagnetic coupling, during operation of device 200, between the signal conveyed through the delay circuit wirebonds 262 and the signal conveyed through the output signal wirebonds 290, and also may reduce electromagnetic coupling between the signal conveyed through the delay circuit wirebonds 262 and the signal conveyed through transistor 250.

According to an embodiment, the lengths (horizontal dimension) of drain terminals 231, 251 are in a range of about 800 microns to about 1800 microns, although the lengths of the drain terminals 231, 251 may be smaller or larger, as well. In addition, the lengths (vertical dimension) of bondpads 261, 263 may be in a range of about 200 microns to about 400 microns, although the lengths of bondpads 261, 263 may be smaller or larger, as well. As is shown in FIG. 2, the bondpads 261, 263 are arranged in parallel with each other, and are aligned with the left edges of the drain terminals 231, 251 (and with the left edges of final-stage FETs 230, 250). In other embodiments, rather than being aligned with the left edges of the drain terminals 231, 251, either or both of the bondpads 261, 263 may be located elsewhere along the width of their respective drain terminals 231, 251 (or more specifically along portions 265, 266 of the drain terminals 231, 251). Further, although both bondpads 261, 263 extend in direction 298 away from the FETs 230, 250 to which they are coupled, in other embodiments, either or both bondpads 261, 263 may extend in other directions (including toward the FET input terminals 229, 249). In other words, although both drain terminals 231, 251 (or the "output terminals") are shown to have an "L" shape in FIG. 2, in other embodiments, the drain terminals 231, 251 may have other suitable shapes (e.g., "T" shapes, triangular shapes, tapered shapes, and so on).

In some embodiments, the combining node structure 264 and the bondpad 266 associated with the drain terminal 251 of the final-stage peaking amplifier FET 250 are the same conductive structure. In other words, the combining node structure 264 may essentially correspond to the drain terminal 251 (or more specifically to bondpad 266). In practice, the combining node structure 264 may be implemented with a conductive structure that is closely electrically coupled to the drain terminal 251 of the final-stage peaking amplifier FET 250. Desirably, the drain terminal 251 is connected to the combining node structure 264 with a conductive path having a negligible phase delay (i.e., as close to zero degrees of phase delay as possible, such as 10 degrees or less of phase delay), and in some embodiments, the drain terminal 251 may be an integrally-formed portion of the combining node structure 264. In other words, the drain terminal 251 of the final-stage peaking amplifier FET 250 may form a portion of the combining node structure 264, in some embodiments.

As indicated above, the drain terminal 231 of the final-stage main amplifier FET 230 is electrically coupled to the combining node structure 264 through the phase delay circuit 260. In particular, the phase delay circuit 260 includes integrated conductive structures between the drain regions of FET 230 (or the drain manifold of FET 230) and conductive structure 265, conductive structure 265, bondpad 261, delay circuit wirebonds 262, bondpad 263, and bondpad 266. The phase delay circuit 260 applies about a 90 degree phase delay to the signal conveyed between the drain regions (or drain manifold) of the final-stage main amplifier FET 230 and the combining node structure 264. In addition, the phase delay circuit 260 imparts an impedance inversion between the final-stage main amplifier FET 230 and the combining node structure 264. As discussed previously, a 90 degree phase difference is present between the main and peaking amplification paths at the inputs of amplifiers 220, 240, and the approximately 90 degree overall phase delay applied by the phase delay circuit 260 enables the amplified main and peaking signals to be combined substantially in phase (or coherently) at the combining node structure 264.

Each of the series-coupled conductive structures between the drain of FET 230 and the combining node structure 264 may contribute to the 90 degree delay applied by the phase delay circuit 260. In addition, the parasitic drain-source capacitances of the final-stage main and peaking FETs 230, 250 affect the overall phase delay applied by the phase delay circuit 260. According to an embodiment, the number, length, and shape of the wirebonds 262 is selected to achieve the 90 degree total electrical length of the phase/delay/impedance inverter circuit 260. For example, according to an embodiment, wirebonds 262 may be configured to have an electrical length (and to apply a phase delay) of about 30 degrees to about 80 degrees to the RF signal carried through the wirebonds 262. A remainder of the 90 degree electrical length/phase delay is provided by the other conductive components of the phase delay circuit 260, as affected by the parasitic drain-source capacitances of the final-stage main and peaking FETs 230, 250. It should be noted that, although FIG. 2 shows four wirebonds 262 connected in parallel with each other between drain terminals 231 and 251, in alternate embodiments, fewer (e.g., as few as two) or more (e.g., 10 or more) wirebonds may be connected in parallel between drain terminals 231 and 251.

According to an embodiment, the phase delay circuit 260 has a CLC (capacitance-inductance-capacitance) topology between drain terminal 231 and drain terminal 251. A first (shunt) capacitance of the CLC topology includes the drain-source capacitance, $C_{dsM}$, of the main amplifier final-stage FET 230. In some embodiments, this first (shunt) capacitance may be augmented with additional capacitance provided by one or more additional shunt capacitors (e.g., MIM capacitors, not illustrated) that are electrically coupled in parallel with $C_{dsM}$, between the main amplifier final-stage FET drain terminal 231 and the die ground reference (e.g., conductive layer 328, FIG. 3). Desirably, for a symmetrical Doherty amplifier, the capacitance of the additional shunt capacitors is selected so that the combined capacitance of $C_{dsM}$ and the additional shunt capacitors is approximately equal to the drain-source capacitance, $C_{dsP}$, of the final-stage peaking amplifier FET 250. For an asymmetric Doherty amplifier, such as that illustrated in FIGS. 2 and 3, the drain-source capacitance, $C_{dsM}$, of the final-stage main amplifier FET 230 may be designed to be lower than the drain-source capacitance, $C_{dsP}$, of the final-stage peaking amplifier FET 250. In an asymmetric Doherty amplifier embodiment, the combined capacitance of $C_{dsM}$ and the additional shunt capacitors, if included, should be designed so that the transmission path (or "pseudo-transmission line") between the final-stage main amplifier FET 230 and the final-stage peaking amplifier FET 250 provides about a 90 degree phase shift at the center frequency of operation. Further, the combined capacitance of $C_{dsM}$ and the additional shunt capacitors, if included, should be designed so that:

$$L_D = \frac{1}{(2*\pi*freq)^2 * C_{DS}}$$

-continued $$Z_C = \sqrt{\frac{L_D}{C_{DS}}},$$

where freq is the center frequency of operation (f0), $L_D$ is the inductance of the conductive path between the drain terminal 231 of the main amplifier final-stage FET 230 and the drain terminal 251 of the final-stage peaking amplifier FET 250, $C_{DS}$ is the output capacitance of the final-stage main amplifier FET 230 and/or the final-stage peaking amplifier FET 250, and $Z_C$ is the characteristic impedance of the pseudo-transmission line between the drain terminal 231 of the final-stage main amplifier FET 230 and the drain terminal 251 of the final-stage peaking amplifier FET 250. For example, the parallel combination of $C_{dsM}$ and the additional shunt capacitors may have a combined capacitance value in a range of about 3 picofarads (pF) to about 10 pF (e.g., about 5 pF to about 6 pF) at a center frequency of operation of about 2.0 gigahertz (GHz), in an embodiment, although the center frequency of operation and/or the combined capacitance could be lower or higher, as well.

The inductance in the CLC topology of the phase delay circuit 260 is primarily provided by the delay circuit wirebonds 262, with small components of the inductance also being provided by the bondpads 261, 263. The delay circuit wirebond(s) 262 each have a first end that is connected to bondpad 261 (which in turn is closely electrically coupled to the final-stage main amplifier FET drains (or drain manifold) through portion 265 of the drain terminal 231), and a second end that is connected to bondpad 263. The bondpad 263 is electrically coupled to the combining node structure 264 (and/or to portion 266 of the drain terminal 251). According to an embodiment, the series combination of drain pad portion 265, bondpad 261, wirebonds 262, bondpad 263, and drain pad portion 266 have a combined inductance in a range of about 0.8 nanohenries (nH) to about 1.2 nH at a center frequency of operation of about 2.0 GHz, although the center frequency and/or the combined inductance could be lower or higher, as well.

Finally, the second (shunt) capacitance in the CLC topology of the phase delay circuit 260 approximately equals the drain-source capacitance, $C_{dsP}$, of the final-stage peaking amplifier FET 250 minus a portion of $C_{dsP}$ that is compensated for by a shunt inductance (e.g., of shunt inductor 282, 282', 282"), as will be explained below. In other words, the second shunt capacitance may be represented by $A \times C_{dsP}$, where $A<1.0$, and $(1.0-A) \times C_{dsP}$ is equivalent to a negative capacitance provided by a compensating shunt inductance (e.g., of shunt inductor 282, 282', 282"). The $C_{dsP}$ capacitance has a capacitance value in a range of about 5 pF to about 10 pF (e.g., about 7 pF to about 8 pF) at a center frequency of operation of about 2.0 GHz, in an embodiment, although the center frequency and/or the capacitance could be lower or higher, as well.

To summarize, the 90 degree phase difference between drain terminal 231 and drain terminal 251 (or combining node 264) is provided by a phase delay circuit 260 with a CLC topology, where that topology includes a first shunt capacitance (e.g., provided by $C_{dsM}$ and possibly additional shunt capacitors), a series inductance circuit (e.g., provided by drain pad portion 265, bondpad 261, delay circuit wirebonds 262, bondpad 263, and drain pad portion 266), and a second shunt capacitance (e.g., provided by $A \times C_{dsP}$, where $A<1.0$ when a compensating shunt inductance is included, as will be described below).

The RF signals amplified though the main and peaking amplification paths are combined substantially in-phase at the combining node 264, as described previously, to produce an amplified output RF signal. The combining node 264 is electrically connected to an output lead 294 (e.g., output node 194, FIG. 1) through a plurality of output signal wirebonds 290 (e.g., inductance 190, FIG. 1), in an embodiment. Accordingly, the amplified output RF signal is conveyed from the combining node 264 to the output lead 294 through wirebonds 290.

According to an embodiment, the output signal wirebonds 290 are configured to have a relatively low inductance, such as an inductance value in a range of about 20 picohenries (pH) to about 70 pH (e.g., about 60 pH) although the inductance value may be smaller or larger, as well. Desirably, wirebonds 290 are designed so that the inductance value of wirebonds 290 is as low as possible.

According to an embodiment, a shunt-L circuit 280 (e.g., shunt-L circuit 180, FIG. 1) is coupled between the final-stage peaking amplifier drain terminal 251 (or combining node 264) and the die ground reference (e.g., conductive layer 328, FIG. 3), in an embodiment. As mentioned previously, the shunt-L circuit 280 is configured to compensate for (e.g., resonate out) the drain-source capacitance at the drain terminal 251 of the final-stage peaking amplifier FET 250. In an embodiment, the shunt-L circuit 280 includes a shunt inductance (e.g., inductance 182, FIG. 1) and a shunt capacitance (e.g., capacitance 184, FIG. 1) coupled in series between the drain terminal 251 of the final-stage peaking amplifier FET 250 and the ground reference. The shunt capacitance is configured to provide a low-impedance path to ground for very low-frequency signal energy (e.g., near DC signal energy), and a high impedance path to ground for signal energy in the band of operation of the amplifier 200. In alternate embodiments, the shunt-L circuit may be coupled instead between the final-stage main amplifier drain terminal 231 and the die ground reference, or shunt-L circuits may be coupled between both drain terminals 231, 251 and the die ground reference.

According to an embodiment, the shunt inductance of the shunt-L circuit 280 is implemented with a set of one or more wirebonds 282 coupled in series with one or more integrally-formed inductors 282', 282". The wirebond(s) 282, which represent a first integrated inductance, each have a first end that is connected to bondpad 266 of drain terminal 251 (which corresponds to or is closely electrically coupled to combining node 264), and a second end that is connected to a bondpad 283 (referred to below as an "inter-inductor node"), where both bondpads 266, 283 are integrally-formed with and exposed at the top surface of die 201. Essentially, the set of wirebonds 282 may be considered an inductance, where the first end(s) of the wirebonds 282 correspond to a first terminal of the inductance, and the second end(s) of the wirebonds 282 correspond to a second terminal of the inductance. In alternate embodiments, more or fewer than two wirebonds may be used to implement the first inductance. In still other alternate embodiments, the set of wirebonds 282 may be replaced with one or more discrete inductors with first and second terminals connected to distinct bonding pads exposed at the top surface of the die 201.

The integrated inductors 282', 282", which together represent a second inductance, are coupled in parallel between the inter-inductor node 283 and a second conductive node 285, which in one embodiment may be an RF cold point node. More specifically, each of the integrated inductors 282', 282" includes an integrally-formed spiral inductor formed from portions of one or more layers of the build-up structure of the die 201 (e.g., build-up layers 312, FIG. 3), where a first terminal (or end) of each spiral inductor is coupled to the inter-inductor node 283, and a second terminal (or end) of each spiral inductor is coupled to node 285. In alternate embodiments, the two, parallel-coupled integrated inductors 282', 282" may be replaced with a single integrated inductor, with more than two parallel-coupled integrated inductors, or with one or more discrete inductors coupled to the top surface of the die 201.

As used herein, a "band of operation" or "operational band" of amplifier 200, 300 means a range of frequencies that is bounded by lower and upper −3 dB cutoff frequencies. According to an embodiment, the shunt inductance of the shunt-L circuit has an inductance value that is selected so that the shunt inductance and the drain-source capacitance, $C_{dsP}$, of the final-stage peaking amplifier FET 250 resonate at a frequency that is below a band of operation of the amplifier 200. For example, the shunt inductance and $C_{dsP}$ may resonate at a frequency that is at least 300 megahertz (MHz) below a band of operation of the amplifier 200 (e.g., the resonant frequency of the shunt inductance and $C_{dsP}$ may be 300-500 MHz below the band of operation, although the resonant frequency may be higher or lower, as well). As a specific non-limiting example, when amplifier 200 has a center frequency of operation, f0, of 2.0 GHz and a 400 MHz wide band of operation between a lower cutoff frequency of 1.8 GHz and an upper cutoff frequency of 2.2 GHz, the resonant frequency of the shunt inductance and $C_{dsP}$ may be 300-500 MHz or more below the lower cutoff frequency (e.g., the resonant frequency may be between 1.3 GHz and 1.5 GHz, although the resonant frequency may be lower or higher, as well). In other embodiments, the center frequency of operation may be less or greater than 2.0 GHz, and the band of operation may be narrower or wider, and accordingly, the shunt inductance value may be selected to resonate with $C_{dsP}$ at a different frequency below the corresponding band of operation.

The shunt inductance of the shunt-L circuit essentially improves the quality of the combining node structure 264 (e.g., improves Zopt and Zmod at the center frequency of operation) by reducing the difference between the effective drain-source capacitances of the final-stage main and peaking amplifier transistors 230, 250. More specifically, because amplifier 200 is an asymmetric Doherty amplifier, the drain-source capacitance, $C_{dsP}$, of the final-stage peaking amplifier transistor 250 is larger than the drain-source capacitance, $C_{dsM}$, of the final-stage main amplifier transistor 230. When the main-to-peaking size ratio is about 1:2, for example, the drain-source capacitance of the final-stage peaking amplifier transistor 250 may be about 50-80 percent greater than the drain-source capacitance ($C_{dsM}$) of the final-stage main amplifier transistor 230 (e.g., for a 1:2 asymmetry ratio, $C_{dsM}$ may be about 3.7 pF and $C_{dsP}$ may be about 4.9 pF). The shunt inductance of the shunt-L circuit is configured to reduce a difference between the drain-source capacitance of the final-stage main amplifier FET 250, $C_{dsM}$, and an effective drain-source capacitance of the final-stage peaking amplifier FET 230, and in some embodiments, the shunt inductance is configured to make the effective drain-source capacitance of the final-stage peaking amplifier FET 250 approximately equal to the drain-source capacitance of the final-stage main amplifier FET 230 (or the effective capacitance of the final-stage main amplifier FET if another shunt inductance is closely electrically coupled to the drain of the final-stage main amplifier FET).

Utilizing the shunt-L circuit 280 to resonate out at least some of the drain-source capacitance of the final-stage peaking amplifier transistor 250 essentially equalizes (or significantly reduces the difference between) the effective drain-source capacitance(s) of the main and peaking final-stage amplifier transistors 230, 250, which improves the quality of the combining node structure 264. In other words, a total shunt inductance provided by the series-coupled arrangement of wirebond(s) 282 and inductors 282', 282" is selected to resonate out at least some of the drain-source capacitance of the final-stage peaking amplifier transistor 250.

For example, in the above-given example of an amplifier 200 with a 1:2 asymmetry ratio, $C_{dsM}$ of about 3.7 pF, and $C_{dsP}$ of about 4.9 pF, a shunt-L circuit 280 with a total shunt inductance of about 5 nH may reduce the effective drain-source capacitance of the final-stage peaking amplifier transistor 250 (i.e., the drain-source capacitance as altered by the shunt inductance) from 4.9 pF to approximately to 3.7 pF (i.e., a value substantially equal to the drain-source capacitance of the final-stage main amplifier transistor 230).

Factors affecting the selection of the total shunt inductance include, for example, the asymmetry ratio between the main and peaking amplifier transistors 230, 250 (and thus the difference in drain-source capacitance between the transistors 230, 250), the power level of the amplifier 200, and the center frequency of operation of the amplifier 200. Generally, as the asymmetry ratio, the center frequency of operation, and/or the power level increases, the selected total shunt inductance decreases, and conversely as the asymmetry ratio, the center frequency of operation, and/or the power level decreases, the selected total shunt inductance increases. For example, for a 30 watt amplifier 200 with a 1:2 asymmetry ratio and a center frequency, f0, of about 2 GHz, a total shunt inductance provided by the series-coupled arrangement of wirebond(s) 282 and inductors 282', 282" may be in a range of about 1 nH to about 10 nH (e.g., about 5 nH) although the total shunt inductance may be lower or higher, as well. All other things being equal, if the center frequency of operation were increased to 4 GHz, the selected total shunt inductance could be decreased to about half the value for a 2 GHz amplifier. Alternatively, if the power level were decreased to 15 watts with all other things being equal, the selected total shunt inductance could be roughly doubled for a 2 GHz amplifier.

According to an embodiment, a portion of the total shunt inductance of the shunt-L circuit 280 is provided by wirebond(s) 282, and another portion of the total shunt inductance is provided by integrated inductors 282', 282". In some embodiments, the portion of the total shunt inductance that is provided by wirebond(s) 282 could be between about 20 percent and about 80 percent of the total shunt inductance of the shunt-L circuit 280. For example, a first inductance provided by wirebond(s) 282 may have an inductance value in a range of about 0.5 nH to about 9.5 nH, and a second inductance provided by parallel-coupled integrated inductors 282', 282" may be in a range of about 0.5 nH to about 9.5 nH for an amplifier 200 with a center frequency of operation of about 2 GHz. Although specific example ranges and values are provided above, in other embodiments, the inductance value of any of elements 282, 282', 282", and/or the total inductance value of all elements 282, 282', 282" may be smaller or larger than the above given ranges.

The shunt capacitance of the shunt-L circuit 280 is implemented with an integrally-formed capacitor 284, in an embodiment. Capacitor 284 has a first terminal (or plate) electrically coupled to node 285, and a second terminal (or plate) electrically coupled to the die ground reference (e.g., conductive layer 328, FIG. 3), in an embodiment. According to an embodiment, capacitor 284 may include one or MIM capacitors formed within the build-up layers of the die 201 (e.g., layers 312, FIG. 3), for example. Alternatively, capacitor 284 may be integrally-formed within the base semiconductor substrate (e.g., substrate 310, FIG. 3) with vertical and/or horizontal conductive layers (e.g., polysilicon) separated by dielectric material. In still other embodiments, capacitor 284 may be a discrete capacitor coupled to the surface of the die 201. In still other alternate embodiments, node 285 may be coupled to a bondpad, capacitor 284 may be an "off-die" capacitor that is connected to a substrate other than the die 201, and wirebonds may be used to electrically couple the bondpad (or node 285) to the off-die capacitor 284. Either way, according to an embodiment, a capacitance value of capacitor 284 is in a range of about 500 pF to about 2000 pF, although the capacitance value of capacitor 284 may be lower or higher, as well.

Although the embodiment of the shunt-L circuit 280 shown in FIG. 2 includes a series-coupled circuit that includes particular components (i.e., wirebonds 282, integrated inductors 282', 282", and integrated capacitor 284) in a particular series order, other embodiments may include different implementations of the shunt-L circuit 280, including different series arrangements of the components, different physical types of components, additional components, or fewer components. By way of non-limiting example, a different series arrangement may include one or more integrated inductors (e.g., inductors 282' and/or 282") with first terminals directly electrically connected to the drain terminal 251, and with second terminals coupled to an inter-inductor bondpad (e.g., bondpad 283), and further may include wirebond(s) (e.g., wirebonds 282) with first ends coupled to the inter-inductor bondpad, and with second ends coupled to node 285. Still other embodiments of a shunt-L circuit 280 may include only wirebonds or only integrated inductors. In addition, the physical components of the inductance of the shunt-L circuit 280 may include any combination of inductive components selected from one or more integrally-formed inductors, one or more sets of wirebonds, and/or one or more discrete inductors, and the inductive components of the shunt-L circuit 280 may be interconnected using any series and/or parallel arrangement to achieve the desired total inductance value for the shunt inductance of the shunt-L circuit 280. Similarly, the physical components of the capacitance of the shunt-L circuit may include any combination of capacitive components selected from one or more integrally-formed capacitors and/or one or more discrete capacitors, and the capacitive components of the shunt-L circuit 280 may be interconnected using any series and/or parallel arrangement to achieve the desired total capacitance value for the shunt capacitance of the shunt-L circuit 280.

As indicated previously, embodiments of Doherty amplifier die 200 also may include one or more video bandwidth (VBW) circuits 286 (e.g., VBW circuit 186, FIG. 1) coupled between the combining node structure 264 and a ground reference. In the embodiment illustrated in FIG. 2, the VBW circuit 286 is electrically coupled to node 285 in the shunt-L circuit 280. According to an embodiment, and as indicated by the circuit schematic illustrated above VBW circuit 286, VBW circuit 286 may include a series circuit that includes multiple components, and more specifically that includes a resistor (or resistance), an inductor (or inductance), and a capacitor (or capacitance) coupled in series in any order between node 285 and a ground reference (e.g., layer 328, FIG. 3). In other embodiments, one or more VBW circuits 286 may be coupled to one or more different nodes (e.g., to drain terminal(s) 231, 251, to gate terminal(s) 225, 245, or elsewhere). Multiple VBW circuits may be coupled along multiple points of each amplification path, as well.

In some embodiments, some or all of the components of the VBW circuit 286 may be integrated with or integrally-formed with the die 201, and/or some or all of the components of the VBW circuit 286 may be discrete components that are connected to a top surface of the die 201. Alternatively, only some of the components of the VBW circuit 286 (e.g., the resistor and/or inductor) may be integrally-formed with or connected to the die 201, while other components (e.g., the capacitor) may be implemented off-chip and electrically connected through conductive connections (e.g., wirebonds). In other embodiments, substantially all of the VBW circuit may be implemented off-chip (i.e., all or portions of the VBW circuit 286 may be provided with circuitry that is not integrated with die 201). For example, in an alternate embodiment, node 285 may be electrically connected to lead 287 (e.g., through wirebonds, as shown), and all or portions of the VBW circuit 286 (i.e., at least one of the resistance, inductance, and/or capacitance of the VBW circuit) may be implemented with external circuitry coupled to lead 287.

According to an embodiment, gate bias voltages for each of the FETs 226, 230, 246, 250 are provided through resistor-divider gate bias circuits 270, 270' (e.g., resistor-divider gate bias circuits 170, 170', FIG. 1). As indicated previously, for proper operation of Doherty amplifier die 200, the main amplifier 220 is biased to operate in class AB mode, and the peaking amplifier 240 typically is biased to operate in class C mode. Because the main amplifier 220 is biased differently from the peaking amplifier 240, the main amplifier resistor-divider gate bias circuit 270 is distinct from (and not electrically connected to) the peaking amplifier resistor-divider gate bias circuit 270'.

In the illustrated embodiments, the main amplifier resistor-divider gate bias circuit 270 includes a bias input terminal 271, resistors 273, 274, and RF isolation circuits 275, 276. Similarly, the peaking amplifier resistor-divider gate bias circuit 270' includes a bias input terminal 271', resistors 273', 274', and RF isolation circuits 275', 276'.

Terminals 271 and 271' each may include a conductive bondpad that is exposed at the top surface of the die 201, and which is configured for attachment of one or more wirebonds. The input terminals 271, 271' enable a main amplifier gate bias voltage to be supplied through a first bias lead 216 (e.g., lead 416, FIG. 4), and a peaking amplifier gate bias voltage to be supplied through a second bias lead 217 (e.g., lead 417, FIG. 4).

Resistors 273, 274 or 273', 274' are electrically connected in series between input terminal 271, 271' and a ground reference. The first resistor 273, 273' has a first terminal electrically coupled to the input terminal 271, 271' and to the gate terminal 225, 245 of a pre-amplifier FET 226, 246. A node between input terminal 271, 271' and resistor 273, 273' is electrically connected to the gate terminal 225, 245 of the pre-amplifier FET 226, 246, and an intermediate node (between resistors 273/273', 274/274') is electrically connected to a gate terminal 229, 249 of a final-state amplifier FET 230, 250. The resistance values of resistors 273, 273', 274, 274' are selected to divide the main or peaking pre-amplifier gate bias DC voltage supplied at input terminal 271, 271' (or at gate terminal 225, 245) into fractions, so that desired DC bias voltages are provided at gate terminals 229, 249. For example, resistors 273/273', 274/274' may have equal or unequal resistance values in a range of about 500 ohms to about 10,000 ohms, although resistors 273/273', 274/274' may have lower or higher resistance values, as well.

To ensure that a significant amount of RF power is not lost through the bias circuits 270, 270', the main and peaking amplifiers 220, 240 are de-coupled (or isolated) from the bias circuits 270, 270' with RF isolation circuits 275/275', 276/276'. More specifically, RF isolation circuits 275, 275' are electrically coupled between a bias input terminal 271, 271' and a gate terminal 225, 245, and RF isolation circuits 276, 276' are electrically coupled between resistor 273, 273' and gate terminal 229, 249. According to an embodiment, each RF isolation circuit 275, 275', 276, 276' includes an integrated, lumped-element equivalent of a quarter wave (lambda/4) transmission line, with a reactive component that resonates at the center frequency of operation, f0, of the amplifier 200. Ideally, using this configuration, the bias circuits 270, 270' emulate infinite impedance at frequencies near the center frequency of operation, thus isolating the bias circuits 270, 270' at those frequencies.

In addition to the gate bias circuits 270, 270', Doherty amplifier die 200 also may include one or more drain bias circuits 277. According to an embodiment, a drain bias circuit 277 includes a bias input terminal 278 and RF isolation circuits 279, 279'. Again, bias input terminal 278 may include a conductive bondpad that is exposed at the top surface of the die 201, and which is configured for attachment of one or more wirebonds. The input terminal 278 enables a drain bias voltage to be supplied through a third bias lead 218 (e.g., lead 418, FIG. 4).

The input terminal 278 is electrically connected to the drain terminals 227, 247 of each of the pre-amplifier FETs 226, 246, in an embodiment, to supply the same DC drain bias voltages to each FET 226, 246. Again, to ensure that a significant amount of RF power is not lost through the bias circuit 277, main amplifier 220 and peaking amplifier 240 are de-coupled (or isolated) from the bias circuit 277 with RF isolation circuits 279, 279'. More specifically, each RF isolation circuit 279, 279' is electrically coupled between the input terminal 278 and a drain terminal 227, 247 of a pre-amplifier FET 226, 246. Each RF isolation circuit 279, 279' may include an integrated, lumped-element equivalent of a quarter wave (lambda/4) transmission line, with a reactive component that resonates at the center frequency of operation, f0. It should be noted that drain bias voltages may be supplied to final-stage amplifier FETs 230, 250 through one or more device output leads (e.g., output lead 294, 494, FIGS. 2, 4) and a connection (e.g., output signal wirebonds 290) between the device output lead and combining structure 264, in an embodiment.

Doherty power amplifier die 200, and more specifically die 201, may be packaged and/or incorporated into a larger electrical system in a variety of ways. For example, a Doherty amplifier die 201 may be packaged within an overmolded or air-cavity power device package (e.g., package 404, FIG. 4). Alternatively, a Doherty amplifier die 201 may be packaged in a surface-mount type of package, such as a no-leads package (e.g., a dual-flat no leads (DFN) or quad-flat no leads (QFN) package). In still other embodiments, Doherty dies 201 may be mounted directly to a module or PCB substrate surface.

Figure 4:
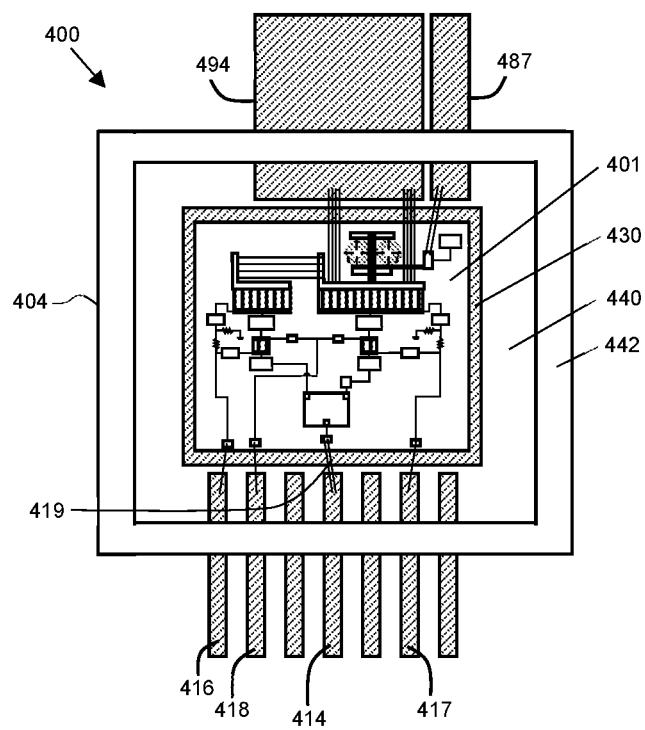
FIG. 4 is a top view of a Doherty amplifier device packaged in a high-power package, in accordance with an example embodiment.

By way of example, FIG. 4 is a top view of a Doherty amplifier device 400 that includes a Doherty amplifier die 401 (e.g., die 201, FIG. 2) packaged in a high-power, discrete device package 404, in accordance with an example embodiment. Die 401 includes the following integrated circuitry: a main amplifier (e.g., main amplifier 220, FIG. 2), a peaking amplifier (e.g., peaking amplifier 240, FIG. 2), a phase delay circuit (e.g., phase delay circuit 260, FIG. 2), a combining node structure (e.g., combining node structure 264, FIG. 2), and a shunt-L circuit (e.g., shunt-L circuit 280, FIG. 2). In some embodiments, die 401 also may include an integrated signal splitter (e.g., signal splitter 204, FIG. 2) and/or a VBW circuit (e.g., VBW circuit 286, FIG. 2), while in other embodiments, the signal splitter and/or VBW circuit may be implemented off-die and/or outside of device 400.

Package 404 includes a plurality of conductive input signal and bias leads 414, 416, 417, 418 (e.g., leads 214, 216, 217, 218, FIG. 2) and at least one output lead 494 (e.g., lead 294, FIG. 2). In some embodiments, package 404 also may include one or more additional bias or other leads. For example, package 404 may include a VBW lead 487 (e.g., lead 287, FIG. 2) that facilitates electrical connection of the die 401 with one or more components of a VBW circuit mounted to a PCB or other substrate (not shown) to which the package 404 is mounted. The input signal and bias leads 414, 416, 417, 418 are positioned at an input side of the package 404, and the at least one output lead 494 and VBW lead 487 (if included) are positioned at an output side of the package 404. The input side (e.g., input side 210, FIG. 2) of the Doherty amplifier die 401 is proximate to and parallel with the input side of the device package 404, in an embodiment.

According to an embodiment, package 404 includes a package substrate, such as a conductive flange 430, to which Doherty amplifier die 401 is physically and electrically connected (e.g., with conductive epoxy, solder, brazing, sintering, or other conductive connection methods). Finally, package 404 includes non-conductive structural features or materials, such as molding compound and/or other insulating materials, which hold the leads 414, 416, 417, 418, 487, 494 and the flange 430 in fixed orientations with respect to each other.

Electrically conductive connections, such as conductive wirebonds, electrically connect input signal and bias voltage bondpads (or terminals) on die 401 to the conductive leads 414, 416, 417, 418 on the input side of the package 404. For example, one or more first wirebonds 419 may electrically connect an input RF signal lead 414 to a first bondpad corresponding to an input terminal (e.g., input terminal 202, FIG. 2), and the input RF signal lead 414 may be used to convey an input RF signal to the Doherty amplifier die 401. In an alternate embodiment in which the signal splitter (e.g., splitter 204, FIG. 2) is not implemented in die 401, separate leads may be used to provide main and peaking RF signals to two bondpads on die 401, where a first bondpad corresponds to an input terminal for the main amplifier, and a second bondpad corresponds to an input terminal for the peaking amplifier. As discussed previously in conjunction with FIG. 2, bias circuits (e.g., bias circuits 270, 270', 277, FIG. 2) on Doherty amplifier die 401 may be electrically connected through additional wirebonds (not numbered) to bias leads 416-418 (e.g., bias leads 216-218, FIG. 2). According to an embodiment, the output of Doherty amplifier die 401 (and more specifically the combining node structure 264, FIG. 2) is electrically connected to the output lead 494 through a plurality of wirebonds (e.g., wirebonds 290, FIG. 2).

In some embodiments, leads 414, 416-518, 487, 494 and flange 430 may form portions of a lead frame. To complete an overmolded package during device manufacturing, after attachment of die 401 and interconnection of wirebonds between the leads and the die 401, the die 401, the interior ends of leads 414, 416-418, 487, 494, the wirebonds, and the upper and side surfaces of flange 430 may be encapsulated with a non-conductive (e.g., plastic) molding compound 440, 442 (only partially shown in FIG. 4 to avoid obscuring the interior components of device 400). The molding compound 440, 442 defines the perimeter of the device 400 from which leads 414, 416-418, 487, 494 protrude, and also defines the top surface of the device 400. The bottom surface of the device 400 is defined partially by the molding compound 440, and partially by the bottom surface of flange 430. Accordingly, when appropriately coupled to a system substrate (e.g., PCB 501, FIG. 5), flange 430 may function to convey a ground reference to the die 401 (e.g., through the bottom conductive layer 328, FIG. 3), and also may function as a heat sink for the device 400.

In a similar but different embodiment, leads 414, 416-418, 487, 494 with the configurations shown in FIG. 4 may be replaced with lands of a no-leads package. The flange 430 and lands again may form a lead frame to which the die 401 and wirebonds are attached, and again the assembly may be encapsulated with a non-conductive molding compound to form a no-leads, surface mount device (e.g., a DFN or QFN device).

In other embodiments, package 404 may be an air-cavity package. In such an embodiment, flange 430 may have a larger perimeter, which is equal or approximately equal to the perimeter of the device 400. A non-conductive insulator (e.g., ceramic, plastic, or another material) with a frame shape may be attached to the top surface of the flange, leads 414, 416-418, 487, 494 may be placed over the non-conductive insulator, wirebonds are attached, and a cap (not illustrated) is placed over the frame opening to encase the interior components of the device 400 in an air cavity.

Although FIG. 4 shows a Doherty amplifier device 400 that includes a single Doherty amplifier die 401 and corresponding leads, other embodiments of Doherty amplifier devices may include multiple Doherty amplifier dies (e.g., multiple instances of die 201, 401) placed side-by-side, with corresponding sets of leads associated with each die. Using such a device, the output RF signals from the multiple Doherty amplifier dies could be combined (e.g., on the PCB to which the Doherty amplifier device is coupled), for example, using a 3-dB coupler or other means.

Figure 5:
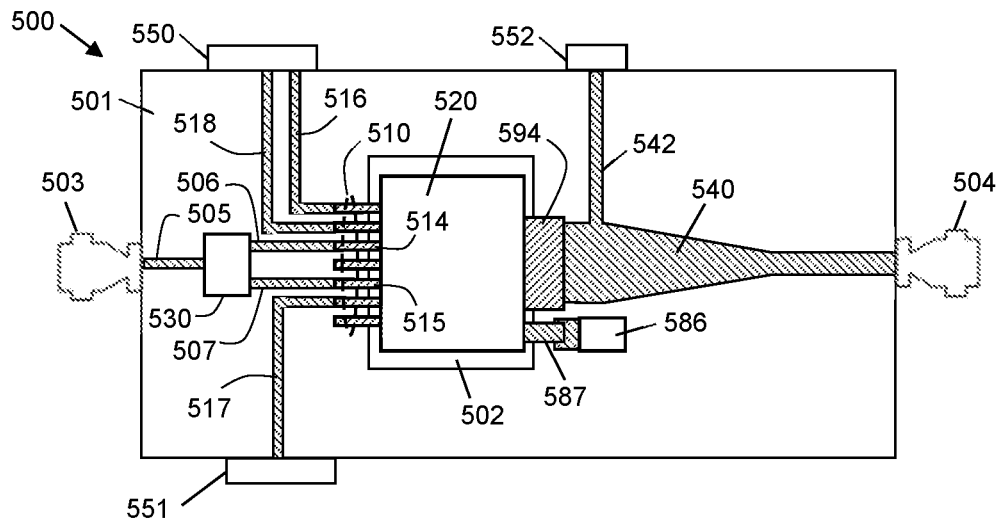
FIG. 5 is a top view of a packaged Doherty amplifier device coupled to a printed circuit board substrate, in accordance with an example embodiment.

Ultimately, Doherty amplifier device 400 is incorporated into a larger electrical system (e.g., a power transmitter lineup in a cellular base station). For example, as illustrated in FIG. 5, a Doherty amplifier device 520 (e.g., device 400, FIG. 4) may be incorporated into amplifier system 500 by coupling the Doherty amplifier device 520 to a system substrate, such as a single-layer or multi-layer PCB 501. The Doherty amplifier device 520 includes a plurality of input-side leads 510 and an output lead 594 (e.g., lead 294, 494, FIGS. 2, 4), in an embodiment, which are configured to convey bias voltages and RF signals between conductive features of the PCB 501 and a die (e.g., die 201, FIG. 2) enclosed within the device 520.

PCB 501 may be a single-layer or multi-layer PCB, and a plurality of elements are coupled to the PCB 501, in an embodiment. According to an embodiment, a conductive coin 502 (or other feature) is embedded within the PCB 501, and top and bottom surfaces of the conductive coin 502 are exposed at top and bottom surfaces, respectively, of the PCB 501. Doherty amplifier device 520 (e.g., device 400, FIG. 4) is connected to the conductive coin 502. More specifically, the bottom surface (e.g., the bottom of flange 430, FIG. 4) of the Doherty amplifier device 520 may be physically and electrically connected to the top surface of the conductive coin 502. The conductive coin 502, in turn, may be electrically connected to system ground, and a bottom surface of the coin 502 may be physically connected to a system heat sink. Accordingly, the conductive coin 502 may function as a ground reference and a heat sink for the amplifier system 500.

In a typical configuration, the amplifier system 500 includes an input RF connector 503 and an output RF connector 504 coupled to the PCB 501, which are configured, respectively, to receive an input RF signal from an RF signal source, and to produce an amplified output RF signal for transmission to a load (e.g., to load 196, FIG. 1, which may be a cellular antenna coupled to connector 504).

The PCB 501 includes a plurality of conductive paths 505, 506, 507, 540 that are electrically coupled between the input and output RF connectors 503, 504 and the Doherty amplifier device 520. Additional conductive paths 516, 517, 518, 542 may be used to convey DC gate and drain bias voltages from bias voltage connectors 550, 551, 552 to the device 520. For example, the conductive paths and features 505-507, 516-518, 540, 542 may be formed from patterned portions of a top conductive layer, a bottom conductive layer, and/or interior conductive layer(s) (if included) of the PCB 501.

In the illustrated embodiment, a signal splitter 530 (e.g., signal splitter 204, FIG. 2) is not integrated within device 520, but instead is implemented as a separate component coupled to the PCB 501. More particularly, a first conductive path 505 electrically connects the input RF connector 503 to an input of signal splitter 530, which is configured to split an input RF signal conveyed through path 505 into first and second RF signals (e.g., corresponding to main and peaking input RF signals). The first and second RF signals are produced at two outputs of signal splitter 530, and the signals are conveyed to first and second RF input leads 514, 515 of Doherty amplifier device 520 through second and third conductive paths 506, 507, respectively. According to an embodiment, signal splitter 530 produces the first and second RF signals so that they have about 90 degrees of phase difference. In other embodiments, the phase difference may be imparted by circuitry that is distinct from the signal splitter 530.

As indicated in the previous paragraph, the Doherty amplifier device 520 in the illustrated embodiment corresponds to a device that includes a Doherty amplifier die that does not include an integrated signal splitter (e.g., splitter 204, FIG. 2). Instead, in the illustrated embodiment, the signal splitter 530 is utilized to split an input RF signal into the first and second (e.g., main and peaking) RF signals. In alternate embodiments, a Doherty amplifier device 520 may include a Doherty amplifier die (e.g., Doherty die 201, FIG. 2) that does include an integrated signal splitter (e.g., splitter 204, FIG. 2), in which case signal splitter 530 may be excluded from the system 500, and the input RF connector 503 may be directly connected to a single input lead (e.g., lead 214, 514) through a single conductive path.

As discussed in detail above, a Doherty amplifier die (e.g., die 201, 401, FIGS. 2, 4) within the Doherty amplifier device 520 amplifies the input RF signal(s) to produce an amplified output RF signal at output lead 594 (e.g., lead 294, 494, FIGS. 2, 4). An additional conductive path 540 on the PCB 501 electrically connects the output RF signal lead 594 of the Doherty amplifier device 520 to the output RF connector 504. Accordingly, the amplified RF signal produced by the Doherty amplifier device 520 is conveyed to the output RF connector 504 through conductive path 540 during operation of the system 500.

As discussed previously, the Doherty amplifier die (e.g., die 201, 401, FIGS. 2, 4) may or may not include an integrated VBW circuit (e.g., VBW circuit 286, FIG. 2). In the embodiment illustrated in FIG. 5, the Doherty amplifier die within Doherty amplifier device 520 does not include an integrated VBW circuit. Instead, Doherty amplifier device 520 includes a VBW lead 587 (e.g., VBW lead 287, 487, FIGS. 2, 4), and a VBW circuit 586 implemented on the PCB 501. For example, the VBW circuit 586 may include a resistor, an inductor, and a capacitor coupled in series between VBW lead 587 and a ground reference.

Figure 6:
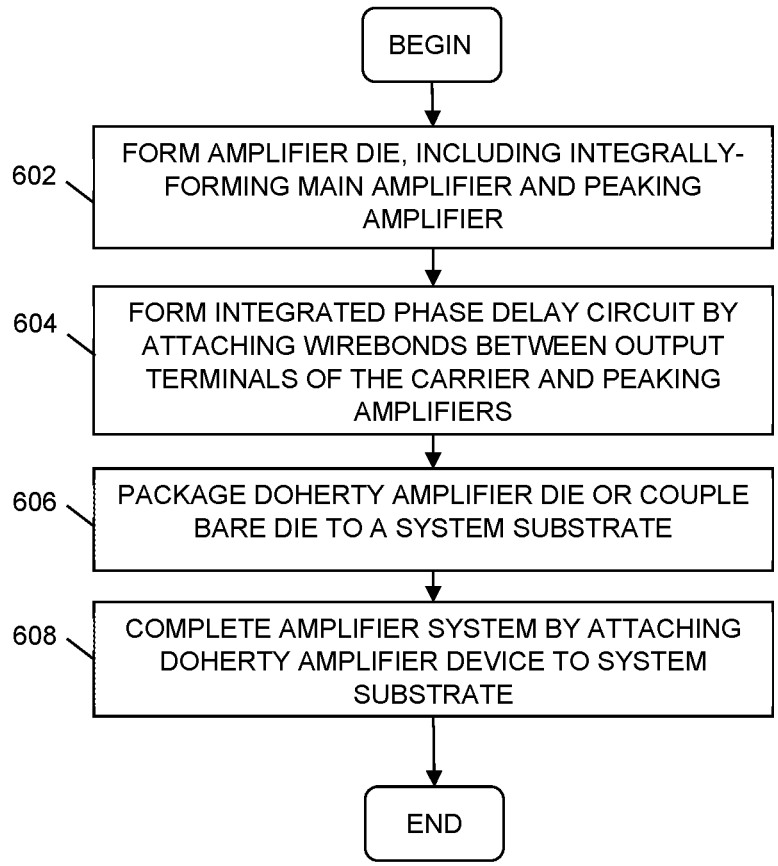
FIG. 6 is a flowchart of a method of making a Doherty power amplifier die, and a packaged Doherty amplifier device, in accordance with an example embodiment.

FIG. 6 is a flowchart of a method of making a multiple-path amplifier, and more specifically a method of making a Doherty power amplifier die (e.g., Doherty amplifier die 201, 401, FIGS. 2, 4), a packaged Doherty amplifier device (e.g., device 400, FIG. 4), and a Doherty amplifier system (e.g., system 500, FIG. 5), in accordance with an example embodiment. The method may begin, in block 602, by forming an amplifier die (e.g., die 201, 401, FIGS. 2, 4), which includes integrally-forming one or more main amplifier transistors (e.g., main amplifier 220, FIG. 2) with a semiconductor die, and integrally-forming one or more peaking amplifier transistors (e.g., peaking amplifier 240, FIG. 2) with the semiconductor die. The output terminals of the main and peaking amplifier transistors may be formed to have configurations as described above in conjunction with FIG. 2. The output terminal of the peaking amplifier corresponds to or is electrically-coupled to an integrated combining node structure (e.g., combining node structure 264, FIG. 2). In addition, forming the amplifier die may include integrally-forming or integrating a power splitter (e.g., splitter 204, FIG. 2), matching networks (e.g., IMN 222, 242, ISMN 228, 248, FIG. 2), bias circuits (e.g., bias circuits 270, 270', 277, FIG. 2), an integrated shunt-L circuit (e.g., shunt-L circuit 280, FIG. 2), VBW circuit(s) (e.g., VBW circuit 286, FIG. 2), and/or other integrated components. In alternate embodiments, some of the circuits and components in the previous sentence may be implemented on substrates that are distinct from the amplifier die.

In block 604, the Doherty amplifier die (e.g., Doherty amplifier die 201, 401, FIGS. 2, 4) is completed by forming an integrated phase delay circuit (e.g., phase delay circuit 260, FIG. 2) between output terminals of the main and peaking final-stage amplifier transistors, which includes coupling wirebonds (e.g., wirebonds 262, FIG. 2) between output terminals of the main and peaking final-stage amplifier transistors. The wirebonds extend in a direction that is angularly offset from (e.g., offset by 30 degrees to 150 degrees, including perpendicular to) a direction of a signal path through the peaking final-stage amplifier transistor. In addition other discrete components may be coupled to the top surface of the die.

The Doherty amplifier die (e.g., Doherty amplifier die 201, 401, FIGS. 2, 4) may then be packaged in block 606. As mentioned previously, the Doherty amplifier die may be packaged in an overmolded or air-cavity package. Alternatively, the Doherty amplifier die may be attached as a bare die to a system substrate (e.g., a module or PCB substrate). When packaged in an overmolded package (e.g., package 404, FIG. 4), the Doherty amplifier die may be connected to a conductive flange of a leadframe, wirebonds may be coupled between input, output, and bias leads of the leadframe and appropriate bondpads of the Doherty amplifier die, and the flange, leads, and Doherty amplifier die may be encapsulated in molding compound. When packaged in an air-cavity package, an insulator frame may be attached to the top surface of a conductive flange, the Doherty amplifier die may be connected to the top surface of the flange in the frame opening, input, output, and bias leads may be connected to the top surface of the insulator frame, wirebonds may be coupled between the input, output, and bias leads and appropriate bondpads of the Doherty amplifier die, and a cap may be applied over the flange, insulator frame, leads, wirebonds, and Doherty amplifier die to encase the Doherty amplifier die in an air cavity.

In block 608, the amplifier system (e.g., system 500, FIG. 5) may be completed by attaching the Doherty amplifier device (e.g., device 400, FIG. 4) (or in some embodiments the bare die) to a system substrate, such as a PCB (e.g., PCB 501, FIG. 5). More specifically, the bottom surface of the Doherty amplifier device may be connected to a conductive coin (e.g., coin 502, FIG. 5) to provide a ground reference and heat sink to the device, and the device's input, output, and bias leads may be connected to corresponding conductive paths (e.g., paths 505-507, 516-518, 540, FIG. 5) of the system substrate.

According to an embodiment, additional components (e.g., splitter 530 and/or VBW circuit 586, FIG. 5) may be coupled to the system substrate (e.g., PCB 501, FIG. 5), in block 610, to complete the amplifier system. The method may then end.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or detailed description.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A multiple-path amplifier comprising:
    a semiconductor die;
    a first transistor integrally-formed with the semiconductor die and having a first output terminal, wherein a first signal path through the first transistor extends in a first direction from a control terminal of the first transistor to the first output terminal;
    a second transistor integrally-formed with the semiconductor die and having a second output terminal and a combining node, wherein the second output terminal corresponds to or is closely electrically coupled to the combining node, and wherein a second signal path through the second transistor extends in a second direction from a control terminal of the second transistor to the second output terminal; and
    an integrated phase delay circuit, which is configured to apply an overall phase delay to a signal carried between the first and second output terminals, wherein the integrated phase delay circuit includes delay circuit wirebonds coupled between the first and second output terminals, and wherein the delay circuit wirebonds extend in a third direction that is angularly offset from the second direction.

2. The multiple-path amplifier of claim 1, wherein the overall phase delay is 90 degrees, and the delay circuit wirebonds are configured to apply 30 degrees to 80 degrees of the overall phase delay.

3. The multiple-path amplifier of claim 1, wherein:
    the first output terminal has an elongated first bondpad with a first length that extends parallel with the first direction of the first signal path, and the delay circuit wirebonds are connected in parallel along the first length of the elongated first bondpad.

4. The multiple-path amplifier of claim 3, wherein the first output terminal also comprises:
    an elongated conductive structure that is electrically coupled to the elongated first bondpad, wherein the elongated conductive structure has a second length that extends perpendicular to the first direction, and the elongated conductive structure is closely electrically coupled to a drain manifold of the first transistor.

5. The multiple-path amplifier of claim 3, wherein:
    the second output terminal has an elongated second bondpad with a second length that extends parallel with the second direction of the second signal path, and the delay circuit wirebonds are connected in parallel along the second length of the elongated second bondpad.

6. The multiple-path amplifier of claim 5, wherein the elongated first bondpad and the elongated second bondpad are arranged in parallel.

7. The multiple-path amplifier of claim 5, wherein the second output terminal al so comprises:
    an elongated third bondpad that is electrically coupled to the elongated second bondpad, wherein the elongated third bondpad has a third length that extends perpendicular to the second direction, and the elongated third bondpad is closely electrically coupled to a drain manifold of the second transistor.

8. The multiple-path amplifier of claim 7, further comprising:
    a set of output signal wirebonds connected to the elongated third bondpad and extending in the second direction.

9. The multiple-path amplifier of claim 1, further comprising:
    a shunt-inductance circuit electrically coupled between the combining node and a ground reference node, wherein the shunt-inductance circuit includes a shunt inductance that is integrated with the semiconductor die.

10. The multiple-path amplifier of claim 9, wherein the shunt-inductance circuit comprises:
    a first integrated inductance that includes a set of wirebonds; and
    a second integrated inductance that includes one or more spiral inductors that are integrally-formed with the semiconductor die, wherein the first and second integrated inductances are coupled in series between the combining node structure and the ground reference node.

11. The multiple-path amplifier of claim 1, further comprising:
    a video bandwidth circuit electrically coupled between the second output terminal and a ground reference node.

12. The multiple-path amplifier of claim 1, wherein the semiconductor die comprises a base semiconductor substrate having bulk resistivity in a range of about 1000 ohm/centimeter (cm) to about 100,000 ohm/cm or greater.

13. The multiple-path amplifier of claim 1, wherein the multiple-path amplifier is a Doherty power amplifier, and wherein:
    the first transistor is a main amplifier transistor; and
    the second transistor is a peaking amplifier transistor.

14. The multiple-path amplifier of claim 13, further comprising:
    a signal splitter integrated with the semiconductor die, wherein the signal splitter is configured to divide power of an input radio frequency (RF) signal into a main input signal that is provided to the main amplifier transistor and a peaking input signal that is provided to the peaking amplifier transistor.

15. A method of making a multiple-path amplifier, the method comprising:
    integrally-forming a first transistor with a semiconductor die, wherein the first transistor has a first output terminal, and wherein a first signal path through the first transistor extends in a first direction from a control terminal of the first transistor to the first output terminal;
    integrally-forming a second transistor with the semiconductor die, wherein the second transistor has a second output terminal and a combining node, wherein the second output terminal corresponds to or is closely electrically coupled to the combining node, and wherein a second signal path through the second transistor extends in a second direction from a control terminal of the second transistor to the second output terminal; and
    forming an integrated phase delay circuit by coupling delay circuit wirebonds between the first and second output terminals, wherein the delay circuit wirebonds extend in a third direction that is angularly offset from the second direction, and wherein the integrated phase delay circuit is configured to apply an overall phase delay to a signal carried between the first and second output terminals.

16. The multiple-path amplifier of claim 1, wherein the integrated phase delay circuit further includes:
the first output terminal; and
the second output terminal.

17. The multiple-path amplifier of claim 7, wherein:
the first length and the second length are in a range between 200 microns and 400 microns; and
the third length is in a range between 800 microns and 1800 microns.

18. The multiple-path amplifier of claim 10, wherein the shunt-inductance circuit further comprises:
a capacitor electrically connected in series with the first and second integrated inductances.

19. The method of claim 15, wherein:
integrally-forming the first transistor includes forming the first output terminal to include an elongated first bondpad; and
integrally-forming the second transistor includes forming the second output terminal to include an elongated second bondpad with a length that extends parallel with the second direction of the second signal path, and wherein the elongated first bondpad and the elongated second bondpad are arranged in parallel.

20. The method of claim 19, wherein forming the integrated phase delay circuit further comprises:
connecting the delay circuit wirebonds between the elongated first bondpad and the elongated second bondpad.

* * * * *